(12) United States Patent
Novakovic

(10) Patent No.: US 12,206,392 B2
(45) Date of Patent: Jan. 21, 2025

(54) TRANSIENT OVERVOLTAGE ACTIVE CLAMPING FOR SEMICONDUCTOR POWER SWITCHES

(71) Applicant: Rockwell Automation Technologies, Inc., Mayfield Heights, OH (US)

(72) Inventor: Bora Novakovic, Thiensville, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 61 days.

(21) Appl. No.: 18/339,030

(22) Filed: Jun. 21, 2023

(65) Prior Publication Data
US 2024/0429910 A1    Dec. 26, 2024

(51) Int. Cl.
| H03K 17/081 | (2006.01) |
| H03K 17/16  | (2006.01) |
| H03K 17/567 | (2006.01) |

(52) U.S. Cl.
CPC ..... *H03K 17/08112* (2013.01); *H03K 17/162* (2013.01); *H03K 17/567* (2013.01)

(58) Field of Classification Search
CPC .......... H03K 17/08112; H03K 17/162; H03K 17/567
USPC ................................ 327/310, 311, 312, 323
See application file for complete search history.

(56) References Cited

U.S. PATENT DOCUMENTS

| 4,459,498 | A | 7/1984 | Stengl et al. |
| 4,679,112 | A | 7/1987 | Craig |
| 5,001,373 | A | 3/1991 | Bator et al. |
| 5,079,608 | A | 1/1992 | Wodarczyk et al. |
| 5,304,802 | A | 4/1994 | Kumagai |
| 5,731,729 | A * | 3/1998 | Ochi ..................... H03K 17/082 |
| | | | 327/384 |
| 6,087,877 | A * | 7/2000 | Gonda ..................... H03K 5/08 |
| | | | 327/309 |
| 6,614,633 | B1 * | 9/2003 | Kohno ............... H03K 17/0822 |
| | | | 361/111 |
| 7,327,546 | B2 * | 2/2008 | Thiery ............... H03K 17/0822 |
| | | | 361/100 |
| 7,453,308 | B2 * | 11/2008 | Tihanyi .............. H03K 17/0822 |
| | | | 327/309 |
| 7,576,964 | B2 * | 8/2009 | Nakahara ........... H03K 17/0822 |
| | | | 361/111 |
| 8,710,894 | B2 * | 4/2014 | Arndt ...................... H01L 23/62 |
| | | | 327/309 |
| 8,937,823 | B2 * | 1/2015 | Jones ................. H03K 17/0812 |
| | | | 363/56.02 |
| 9,013,848 | B2 | 4/2015 | Lui |
| 9,490,244 | B2 * | 11/2016 | Barrenscheen ..... H01L 27/0266 |
| 9,866,211 | B2 * | 1/2018 | Laich ................. H03K 17/0828 |
| 10,234,880 | B1 | 3/2019 | Li et al. |
| 10,620,650 | B2 * | 4/2020 | Iwamizu ................. G05F 1/573 |

(Continued)

*Primary Examiner* — William Hernandez
(74) *Attorney, Agent, or Firm* — Fletcher Yoder, P.C.

(57) ABSTRACT

A system may include a switch, a gate driver, and a signal conditioner. The switch may couple to a load. The gate driver may generate one or more gating signals to control one or more operations of the switch. The signal conditioner may receive an input signal associated with the switch and generate a modification signal that may modify the one or more gating signals based on the input signal. The modified gating signal may be used to reduce an amplitude of a voltage transient received by the switch to below a voltage threshold.

20 Claims, 14 Drawing Sheets

(56) References Cited

U.S. PATENT DOCUMENTS

| | | | |
|---|---|---|---|
| 11,711,021 B2* | 7/2023 | Wang | H03K 17/0812 |
| | | | 363/16 |
| 2001/0017783 A1 | 8/2001 | Bruckmann et al. | |
| 2013/0033909 A1 | 2/2013 | Jones et al. | |
| 2013/0155560 A1* | 6/2013 | Takeuchi | H03K 17/166 |
| | | | 361/89 |
| 2018/0159520 A1* | 6/2018 | Vytla | H03K 17/063 |
| 2018/0269865 A1* | 9/2018 | Song | H01L 29/0649 |
| 2019/0260368 A1* | 8/2019 | Vytla | H03K 17/163 |

* cited by examiner

TRANSIENT OVERVOLTAGE ACTIVE CLAMPING FOR SEMICONDUCTOR POWER SWITCHES

BACKGROUND

The present disclosure generally relates to overvoltage protection for semiconductor power switches. More specifically, the present disclosure relates to systems and methods for using overvoltage protection circuits to protect semiconductor power switches from transient short term overvoltage.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

An industrial automation system may include a variety of automatic components associated with different types of motors, motor-drives, converters, inverters, power supplies, and so on. Operations of the automatic components may include using automatic semiconductor power switches (e.g., switches based on various transistors such as metal-oxide-silicon transistors (MOSFETs), insulated-gate bipolar transistors (IGBTs), or bipolar junction transistors (BJTs), and other semiconductor devices). For example, an automatic semiconductor power switch may automatically switch electrical power between two input power sources. Alternatively, an automatic semiconductor power switch may serve as lock-out switch to prevent specific loads (e.g., motors, motor-drives) from operating on a fault or abnormal condition (e.g., overvoltage) that is out of a design limit (e.g., rated operating voltage).

In some cases, increasing power ratings of the automatic components may create difficulties to reduce certain undesired outcomes (e.g., stray inductances in a power carrying structure) caused by the increasing power ratings. For example, an automatic system or component may operate on a rated electrical voltage or current associated with a switching condition by using an automatic semiconductor power switch. The automatic semiconductor power switch may be designed with a capability of withstanding and protecting itself from certain fault or abnormal conditions (e.g., transient overvoltage). For instance, the automatic semiconductor power switch may include one or more overvoltage protection circuits for protecting the automatic semiconductor power switch from an overvoltage condition caused by the stray inductances. However, the vulnerability of an automatic semiconductor power switch to certain fault or abnormal conditions, such as sustained overvoltage, difficulty with tight tolerances, constantly evolving semiconductor switching technology, and tighter standards, may create challenges in an automatic semiconductor power switch design.

SUMMARY

A summary of certain embodiments disclosed herein is set forth below. It should be understood that these aspects are presented merely to provide the reader with a brief summary of these certain embodiments and that these aspects are not intended to limit the scope of this present disclosure. Indeed, this present disclosure may encompass a variety of aspects that may not be set forth below.

In one embodiment, a system may include a switch, a gate driver, and a signal conditioner. The switch may couple to a load. The gate driver may generate one or more gating signals to control one or more operations of the switch. The signal conditioner may receive an input signal associated with the switch and generate a modification signal that may modify the one or more gating signals based on the input signal. The modified gating signal may be used to reduce an amplitude of a voltage transient received by the switch to below a voltage threshold.

In another embodiment a circuit may include a dead band circuit, a high-pass filter circuit, and an attenuator circuit. The dead band circuit may include one or more Zener diodes or one or more transient voltage suppressor (TVS) diodes. The high-pass filter circuit may include a resistor-capacitor circuit. The attenuator circuit may include a set of resistors coupled in series with a resistor. The circuit may couple across a semiconductor switch providing power to a load component.

In yet another embodiment, a method may include using an attenuator circuit of a signal conditioning circuitry to attenuate one or more voltage transients associated one or more signals received by a semiconductor switch and below a first voltage threshold, and convert a voltage signal below the first voltage threshold and associated with the one or more signals into a modification signal used to modify a gating signal generated from a gate driver circuitry. The method may also include using a dead band circuit of the signal conditioning circuitry to attenuate a first voltage transient associated the one or more signals and above the first voltage threshold. The first voltage transient is associated with a first duration greater than a threshold amount of time. Moreover, the method may include using the dead band circuit to pass, within the threshold amount of time, a second voltage transient received by the semiconductor switch and above the first voltage threshold. The second voltage transient is associated with a second duration less than the threshold amount of time. Further, the method may include using the dead band circuit to attenuate the second voltage transient to below a second voltage threshold. The second voltage threshold corresponds to a maximum voltage allowable for the semiconductor switch and greater than the first voltage threshold. Additionally, the method may include using a high-pass filter circuit to pass a portion of the modification signal having frequency contents higher than a frequency threshold. Furthermore, the method may include using a comparison circuit of a shunt circuitry of the signal conditioning circuitry to determine whether the gating signal exceeds a Miller plateau voltage threshold. In response to determining that the gating signal is below the Miller plateau voltage threshold, the method may include using an amplifier circuit to amplify the portion of the modification signal and using a modulator circuit to inject the amplified portion of the modification signal to the gate driver circuitry to modify the gating signal into a modified gating signal. The modified gating signal may enable the shunt circuitry, thereby disabling the semiconductor switch to reduce an amplitude of second voltage transient within the threshold amount of time.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
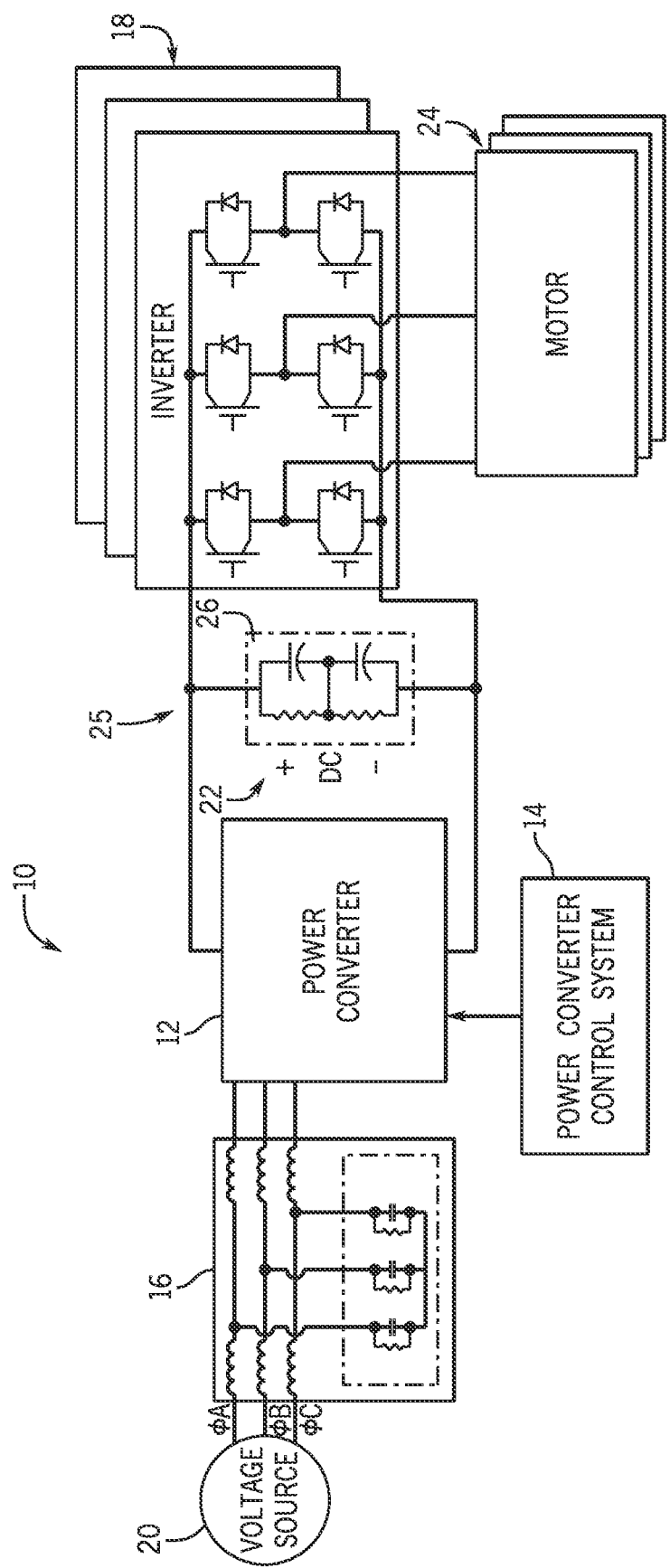
FIG. 1 illustrates a block diagram of a motor-drive system associated with an industrial automation system, in accordance with an embodiment presented herein.

One or more specific embodiments of the present disclosure will be described below. In an effort to provide a concise description of these embodiments, all features of an actual implementation may not be described in the specification.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. As used herein, the terms "computing system" and "controller" may refer to an electronic computing device such as, but not limited to, a single computer, virtual machine, virtual container, host, server, laptop, and/or mobile device, or to multiple electronic computing devices working together to perform the function described as being performed on or by the computing system or the controller.

In certain embodiments, industrial automation systems and automated equipment may include a variety of electrical components, such as motors (e.g., alternating current (AC) motors, direct current (DC) motors), motor-drives (e.g., single phase motors, multiphase motors), converters (e.g., step-up, or step-down power converters), inverters (e.g., AC-to-DC, or DC-to-AC inverters).

A variety of automatic semiconductor power switches may be used to control operations of the electrical components associated with the automated equipment. For example, one automatic semiconductor power switch may automatically switch electrical power between two 120 volts input power sources (e.g., having different phases) used by an electrical component (e.g., power converter). Alternatively, another automatic semiconductor power switch may serve as lock-out switch to prevent the electrical component from operating on a fault condition (e.g., transient, or sustained overvoltage) that may be over a design limit (e.g., rating voltage of the power converter).

With increasing power ratings of the automated equipment, semiconductor power switches may be vulnerable to certain fault conditions, such as transient (e.g., short and fast) overvoltage, sustained (e.g., enduring and slow) overvoltage, and the like. In such cases, the semiconductor power switches may incorporate some protection features (e.g., overvoltage protections, short circuit protections, surge protections) to be capable of withstanding and protecting itself from the fault conditions. However, certain conditions, such as sustained overvoltage, difficulty with tight tolerances, constantly evolving semiconductor switching technology, and tighter standards, may create challenges for designing the semiconductor power switches with enhanced protections from the fault conditions.

For example, the increasing power ratings may result in certain undesired outcomes (e.g., stray inductances in a power carrying structure) that may inhibit overvoltage protections of the semiconductor power switches. In an industrial automation process, an automatic system or component may operate on a rated electrical voltage or current associated with certain switching conditions controlled by an automatic semiconductor power switch. One aspect of the overvoltage protections includes protecting the semiconductor power switch from an overvoltage resulted from the stray inductances during certain conditions (e.g., change in current over time (di/dt) condition that exceeds a threshold). Such conditions may occur during fault recovery processes (e.g., associated with fault recovery transients).

Different overvoltage protection systems and methods may be used to protect the semiconductor power switch from fault conditions. For example, an overvoltage protection system may include protection circuits to modify a gating signal used to control a transistor of the semiconductor power switch using signal conditioning circuits. With the modified gating signal, the semiconductor power switch may be turned back on for a short period of time during a turn off transient. In this way, the modified gating signal combined with other control signals (e.g., from a gate driver of the transistor) may help dissipate the energy accumulated in the stray inductances and suppress (e.g., clamp) an overvoltage.

In certain cases, implementing an overvoltage protection system including signal conditioning circuits for a semiconductor power switch may be challenging. For example, certain operation conditions associated with the semiconductor power switch, such as relative high transients, voltages, and/or currents may create difficulties for implementing the overvoltage protection system under such operation conditions. Certain overvoltage protection systems may use transient voltage suppressor (TVS) or Zener diode in breakdown during the transient operations of the semiconductor power switch. However, such overvoltage protection systems may be vulnerable to the sustained overvoltage, difficulty with tight tolerance, difficulty with flexible fine tuning, tighter semiconductor power switch standards, and so on.

Embodiments of the present disclosure are generally directed toward active overvoltage clamping for protecting the semiconductor power switch from transient overvoltage. The semiconductor power switch may operate as a part of an inverter leg in an electrical component, such as in single phase or multiphase motor drives, power converters, power inverters, or other suitable electrical components associated with various automated equipment. Such electrical component may be vulnerable to overvoltage caused by transients during short circuit events. An overvoltage protection system may use a signal conditioning circuit and a gate driving circuit to control operations of a transistor of the semiconductor power switch. The transistor may include an insulated gate bipolar transistor (IGBT), a bipolar junction transistor (BJT), metal-oxide semiconductor field effect transistor (MOSFET), or any suitable semiconductor devices.

With the foregoing in mind, in an embodiment, the signal conditioning circuit of the overvoltage protection system may receive an input signal, such as a voltage (e.g., $V_{CE}$ voltage defined as a voltage falling across a collector-emitter junction of a transistor) across a semiconductor power switch. The signal conditioning circuit may output a waveform modification signal to alter the gating signal produced by a gate driver in such a way that a rated voltage (e.g., $V_{CE}$) for the semiconductor power switch may not be exceeded during a turn off operation that may be associated with a change in current over time (di/dt) transients (e.g., after a short circuit event) that is great than some threshold.

Certain concepts of using semiconductor power switches in an industrial automation system will be discussed in detail below with reference to FIGS. 1-2. With that in mind, additional details with regard to different overvoltage protection systems for protecting the semiconductor power switches from different fault conditions, such as overvoltage protection systems using different signal conditioning circuits and/or gate driving circuits to protect the semiconductor power switches from transient or sustained overvoltage, will be discussed in detail below with reference to FIGS. 3-15.

Figure 2:
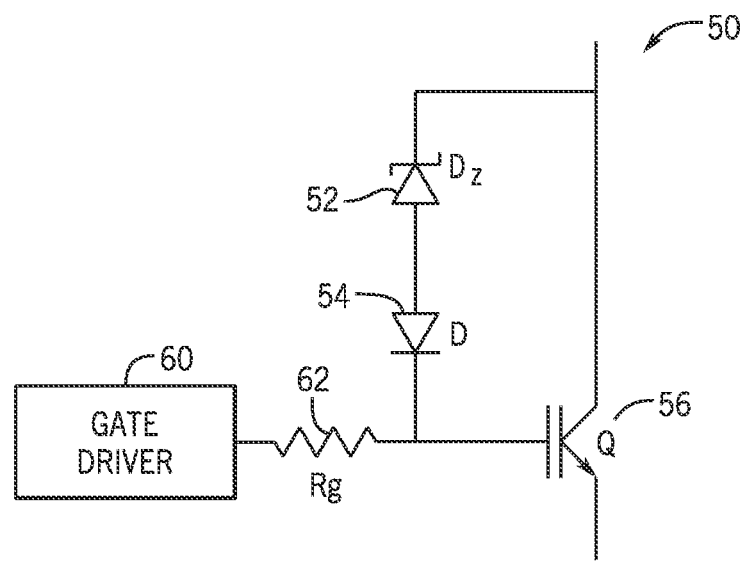
FIG. 2 illustrates a circuit diagram of an overvoltage protection system including a diode plus Zener diode arrangement that may be used in the motor-drive system of FIG. 1, in accordance with an embodiment presented herein.

By way of introduction, FIG. 1 is a block diagram of a motor-drive system 10, which may be part of an industrial automation system in which the embodiments described herein may be implemented. The motor-drive system 10 may include a power converter 12 and a power converter control system 14 that may control the operation of the power converter 12. The motor-drive system 10 may also include a filter 16 and one or more inverters 18. The filter 16 may filter the input alternating current (AC) voltage provided to the power converter 12, while the one or more inverters 18 may convert the DC voltage output by the power converter 12 into a controllable AC voltage, as will be discussed below. In one embodiment, the filter 16 may be positioned between a voltage source 20 and the power converter 12 to reduce input harmonics that may have been caused by power conversion devices (e.g., thyristors, insulated gate bipolar transistor (IGBT), diodes) switching in power converter 12.

In general, the power converter 12 may receive three-phase alternating current (AC) voltage from the voltage source 20 and convert the AC voltage into a direct current (DC) voltage 22 suitable for powering loads (e.g., one or more inverters 18). In certain embodiments, the one or more inverters 18 then convert the DC voltage 22 to an AC voltage to be supplied to one or more devices connected to the one or more inverters 18, such as one or more motors 24. The one or more inverters 18 may then, in turn, control the speed, torque, or other suitable operations of the one or more motors 24 by controlling the AC voltage provided to the motors 24. It should be understood that the industrial automation system may include one or more motor-drive systems 10, and each of the motor-drive systems 10 may include one or more additional components not depicted in FIG. 1.

The power converter 12 and/or one or more inverters 18 may include any suitable rectifier devices that include a number of semiconductor power switches. For example, the power converter 12 may be an active front end (AFE) converter, a diode converter, a thyristor converter, a diode front end rectifier, or the like. In certain embodiments, the semiconductor power switches of the power converter 12 may include semiconductor devices, such as transistor-based (e.g., BJT, MOSFET, IGBT, or other suitable transistor-based) devices or other suitable devices in which the opening and/or closing of the semiconductor power switches may be controlled using an external signal (e.g., gating signal), which may be provided by the power converter control system 14. The power converter 12 may provide the DC voltage 22 (e.g., a regulated DC output voltage) on a direct current (DC) bus 25, which may be provided to the one or more inverters 18 and may regenerate extra or additional power back to the voltage source 20. In this way, the power converter 12 may operate to maintain a unity power factor, generate a stable DC voltage (e.g., DC voltage 22) from the voltage source 20, control a power factor transmitted to the one or more inverters 18, or the like to generally control power supplied to the one or more inverters 18.

In certain embodiments, a semiconductor power switch of the converter 12 or the one or more inverters 18 may include an overvoltage protection system. FIG. 2 is a circuit diagram of the overvoltage protection system 50 including a diode plus Zener diode structure that may be used in the motor-drive system of FIG. 1. The overvoltage protection system 50 including a transient voltage suppressor (TVS) or Zener diode ($D_Z$) 52 and a diode (D) 54 may be used to protect a semiconductor power switch 56 (e.g., a switch component Q2) from a transient overvoltage. For example, a combination of an operation diode (e.g., power diode) and a Zener diode (MOS-based) may be implemented between a gate terminal and a drain terminal of a transistor of a semiconductor power switch to prevent the transient overvoltage by gating (e.g., using a gating signal) the transistor to turn ON. The diode plus Zener diode structure is used in conjunction with the transistor to form the overvoltage protection system 50 that may clamp the transient overvoltage.

In certain embodiments, the diode plus Zener diode structure is used for balancing of the series connected insulated gate bipolar transistors (IGBTs), In certain embodiments of this balancing circuitry, a combination of a resistor-capacitor circuit (RC circuit), and a capacitor discharge circuit implemented as a forward bias blocking diode is sometimes used to reduce balancing circuitry miss operations (e.g., caused by reverse recovery charge of clamping diodes on the turn off waveform of the voltage across the switch). In such cases, a capacitor may quickly discharge reverse recovery charge during an initial stage of a collector emitter voltage ($V_{CE}$) increasing (e.g., during switch OFF), avoiding the effects that the uncontrolled reverse recovery charge can have on transient waveforms, that may in effect disturb the balance of ($V_{CE}$) voltages in a series connected IGBTs arrangements that are sometimes used in a medium voltage applications switches. The IGBT minimum turn on time may also be shortened, enabling smother start-up of a load (e.g., motor).

In certain embodiments, the overvoltage protection system 50 including the diode plus Zener diode (or Zener diode string) structure may be used to gate a main switch in case of a transient short-term overvoltage (e.g., collector emitter voltage ($V_{CE}$)) that occurs after a fault recovery switch OFF event, thereby protecting the switch from a transient short-term overvoltage. An additional controllable switch may be used with associated circuits that facilitates conditional operations of the overvoltage protection system 50. The overvoltage protection may be enabled or disabled based on a DC bus voltage and gating signals (e.g., generated by a gate driver 60 with a gate resistance 62). For example, the overvoltage protection may not be used if the switch is not switching or if a converter in which the protected switch is being used is experiencing a sustained long term overvoltage condition.

Figure 3:
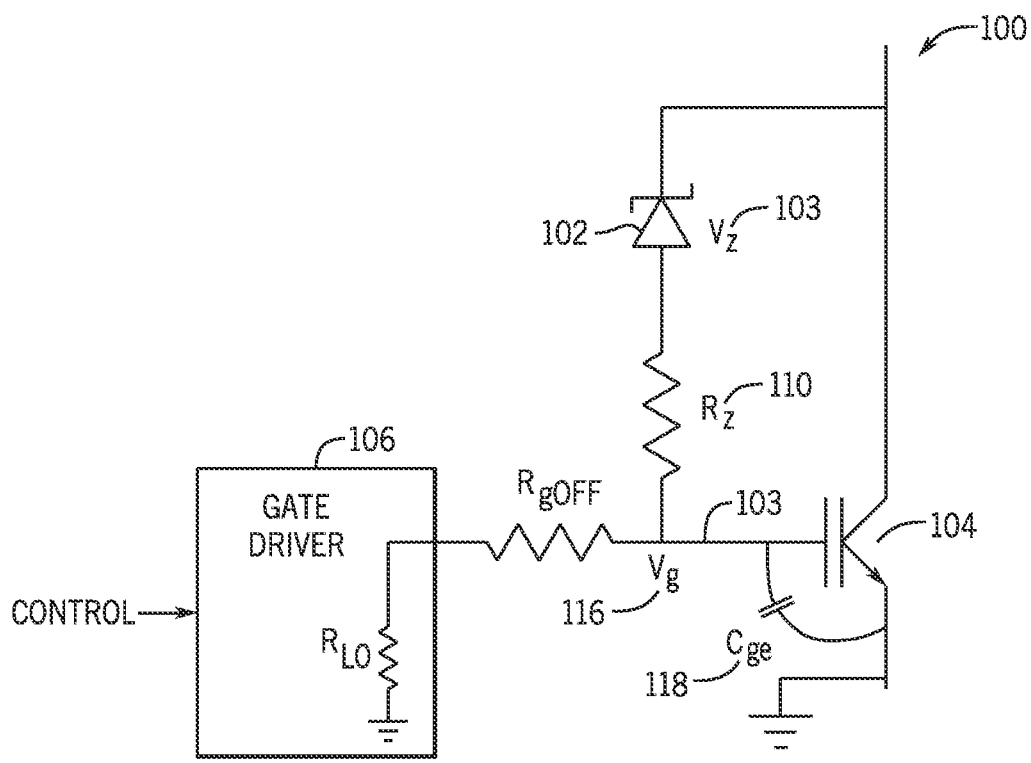
FIG. 3 illustrates a circuit diagram of a Zener diode-based overvoltage protection system that may be used in the motor-drive system of FIG. 1, in accordance with an embodiment presented herein.

The embodiments described above (e.g., the Zener diode-based overvoltage protection) may have certain limitations in semiconductor power switch operations having both transient and sustained overvoltage. To help elaborate such limitations, FIG. 3 illustrates a circuit diagram of a Zener diode-based overvoltage protection system 100 that may be used in the motor-drive system 10 of FIG. 1. The Zener diode-based overvoltage protection system 100 utilizes a Zener (or TVS) diode 102 (or diode string) with a Zener voltage 103 to provide a clamping voltage threshold. Once the clamping voltage threshold is exceeded, Zener clamping circuitry may breakdown and conduct current into a gate 103 causing a rise of the gate voltage 116 ($V_g$) and a partial turn ON of a main switch 104, resulting in a clamping effect. In such case, a clamping circuit may need to provide a significant current to a gating circuit (e.g., gate driver 106) in order to achieve the partial semiconductor power switch ON and the clamping effect.

An internal resistance (Rz) 110 of the clamping Zener diode 102 may produce a resistive divider with the gate driver 106. The resistor divider determines a clamping voltage in relation with the gating voltage ($V_g$) 116 used to turn on the main switch 104, a breakdown voltage of the Zener diode (or string of Zener or TVS diodes) 102, and delta effects caused by a gate-emitter capacitance ($C_{ge}$) 118 and Miller capacitances being charged. Since Zener diode internal resistance (RZ) 110, gate-emitter capacitance ($C_{ge}$) 118 and Miller capacitances may vary with temperature and from part to part, the actual clamping voltage accuracy may be impacted and, in some cases, may exceed a maximum voltage of the main switch 104 that is intended to be protected. Such uncertainties may reduce the effectiveness and reliability of the overvoltage protection discussed herein.

In addition to the source of uncertainties mentioned above, another source of uncertainties for the overvoltage protection effectiveness is the variation of turn OFF transient times of the main switch 104. The overvoltage protection circuitry discussed herein should act faster than the transient time of the main switch 104. Indeed, as the technology advances and semiconductor power switches are getting faster, the timing constrains for the overvoltage protection circuitry of the type discussed herein may become more challenging to accommodate.

In addition to speed limitations (e.g., switch turn ON delay), the Zener diode-based overvoltage protection system 100 may have other limitations such as a lack of fine-tuning capability, resulting in additional clamping voltage accuracy problems and overvoltage protection system effectiveness. For the Zener diode-based overvoltage protection system 100, the type and number of diodes in the diode string may be the only open design variables to use, therefore tuning of the exact clamping voltage may be difficult because of the tolerances in the Zener or TVS diodes breakdown voltage. For example, TVS diodes in many cases have more than 15% of margin between a standoff voltage and a breakdown voltage. The breakdown voltage may have additional 10% tolerance and may be temperature dependent. Moreover, the breakdown voltage of the clamp Zener or TVs diodes may vary with current. The breakdown voltage at a datasheet specified current may be 30% or 40% apart from the breakdown voltage at the current needed to turn on the main switch 104 and effectively achieve the overvoltage clamping.

Furthermore, in cases of a slow and sustained extreme DC bus overvoltage (e.g., that may be caused by irregular motor regeneration operation), an overvoltage clamping circuit may be brought into a breakdown region. In such cases, an excessive power dissipation may damage a clamping diode string of the overvoltage clamping circuit. Additionally, if the overvoltage is high enough, the current sourced by the overvoltage protection circuitry embodiments discussed herein may overpower the gate driver 106 and keep the main switch 104 in continuous, partial, or full turn on state. This may eventually cause shoot through in an inverter or converter leg and damage the inverter or the converter.

Figure 4:
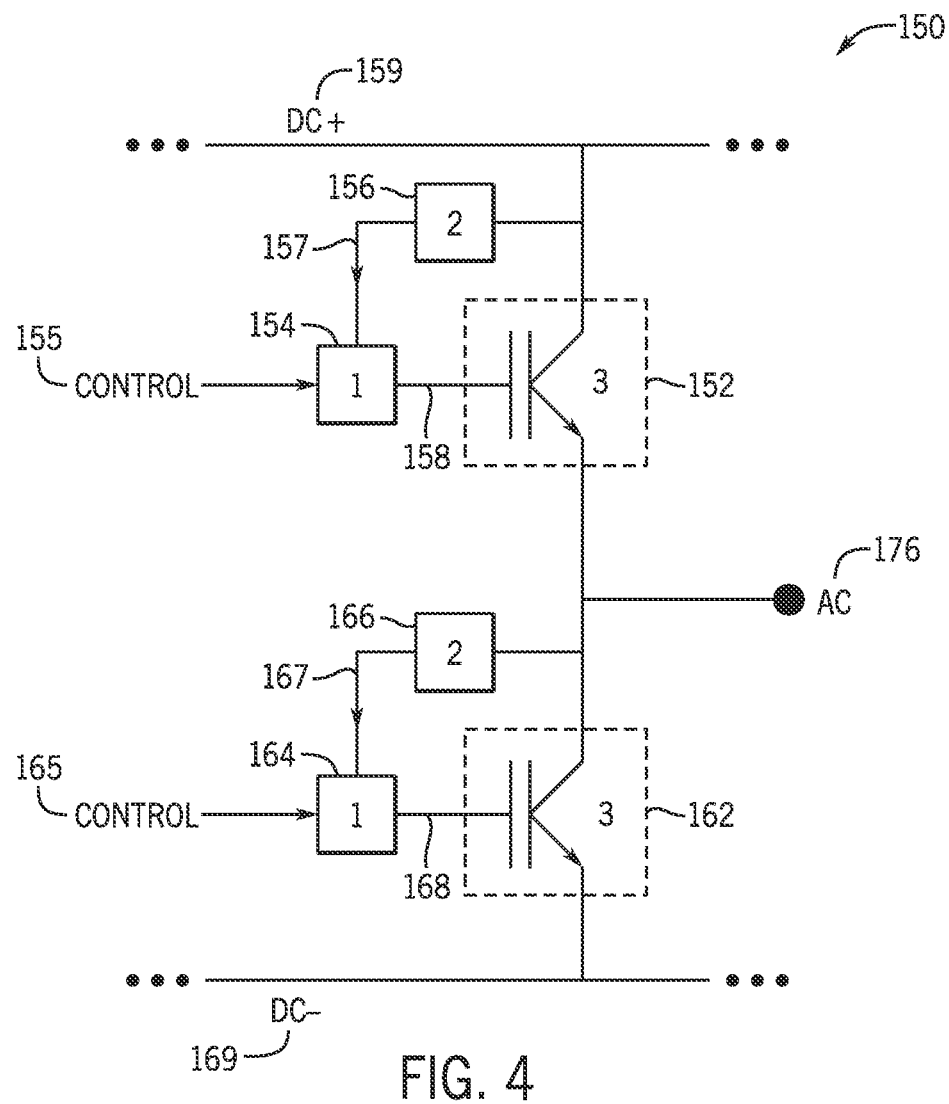
FIG. 4 illustrates a block diagram of a motor drive inverter phase leg with certain functional blocks that may be used in the motor-drive system of FIG. 1, in accordance with an embodiment presented herein.

With the foregoing limitations in mind, FIG. 4 illustrates a block diagram of a motor drive inverter phase leg 150 with functional blocks that may be used in the motor-drive system 10 of FIG. 1 to effectively account for the issues described above. The functional blocks may include signal conditioning blocks 156 and 166 that may operate in conjunction with gate drivers 154 and 164 and semiconductor power switches 152 and 162 to clamp an overvoltage (e.g., short term transient overvoltage, less than some threshold amount of time) associated with the semiconductor power switches 152 and 162, respectively. The semiconductor power switches 152 and 162 may include IGBT, BJT. MOSFET, or any other similar devices. The semiconductor power switches 152 and 162 may operate as a part of an inverter leg (e.g., in single or multiphase motor drives, in power converters, or in similar DC/DC or AC/DC inverters). Short circuit events are common in motor drives, grid-connected inverters and similar systems and may create high currents flowing instantly through a semiconductor power switch, which is a building block of a power conversion system. The short circuit protection logic in power conversion systems (e.g. motor drives and similar systems) may detect a short circuit condition and attempt to turn OFF potentially affected semiconductor power switches. During this attempted turn OFF, high overcurrent levels flowing through the affected semiconductor power switches experiencing the short circuit events may be interrupted. The interruption of the high current levels may in turn cause a high transient di/dt that may create high transient overvoltage across stray inductances of power structures (e.g. busbars, laminated bus, power module bonding wires and connections) within a system. This transient overvoltage may in some cases be high enough to damage the affected semiconductor power switches. For the purpose of this explanation, the motor drive inverter phase leg illustrated in FIG. 4 may be affected by a short circuit event on its output 176. The motor drive inverter phase leg includes the semiconductor power switches 152 and 162, both equipped with the signal conditioning blocks 156 and 166. Depending on the time of the short circuit event with the respect to switching commands 155 and 165 given by a controller (e.g., a motor drive controller), the semiconductor power switches 152 and 162 may be affected by a short circuit overcurrent and may be commanded to turn OFF by the controller. This means that the affected switches may interrupt the short circuit current in the resulting process and may experience an overvoltage condition.

The overvoltage protection for the semiconductor power switch 152 is illustrated as the signal conditioning block 156 operating together with the semiconductor power switch 152 and the gate driver 154 in order to achieve an active clamping effect and protect the semiconductor power switch 152 from overvoltage during a short circuit turn OFF transient. In the same way, the overvoltage protection for the semiconductor power switch 162 is illustrated as the signal conditioning block 166 operating together with the semiconductor power switch 162 and the gate driver 164 in order to achieve the active clamping effect and protect the semiconductor power switch 162 from overvoltage during the short circuit turn OFF transient described above. The motor drive inverter phase leg 150 may be powered by DC bus voltages 159 (DC+) and 169 (DC−).

With the preceding in mind, the following sections illustrate interactions between the protected semiconductor power switch 152, the signal conditioning block 156, and the gate driver 154. The semiconductor power switch 152 may be controlled by the gate driver 154 and the signal conditioning block 156. The gate driver 154 may receive a control signal 155 from a controlling device (e.g., motor inverter control, active front end converter controller or similar). In the case of a short overvoltage across the switch 152, that may be caused by an event like short circuit recovery turn OFF transient or similar, the signal conditioning block 156 may use a collector-gate voltage, which is representative of collector-emitter voltage $V_{CE}$ across the semiconductor power switch 152 to generate a waveform modification signal 157 that may modify a gating signal 158 produced by the gate driver 154. That is, the waveform modification signal 157 may adjust the output of the gate driver 154 (e.g., the gating signal 158) and modify the operation of the semiconductor power switch 152 to be temporarily turned on (e.g., within a threshold time period time of the short circuit event with the respect to switching command 155) to clamp or attenuate the collector-emitter voltage $V_{CE}$ across the semiconductor power switch 152 to below a maximum $V_{CE}$ allowable for the semiconductor power switch 152 to prevent damage from occurring within the semiconductor power switch 152. The waveform modification signal 157 may be generated only for a short period of time during the short overvoltage and not by other events that may be encountered (e.g., during the normal operation of the overvoltage protection system).

In the same manner, the semiconductor power switch 162 may be controlled by the gate driver 164 and the signal conditioning block 166. The gate driver 164 may receive the switching command 165 from a controlling device (e.g., motor inverter control, active front end converter controller or similar). In the case of a short overvoltage across the switch 162, that may be caused by an event like short circuit recovery turn OFF transient, the signal conditioning block 166 may use a collector gate voltage, which is representative of collector-emitter voltage $V_{CE}$ across the semiconductor power switch 162 to generate a waveform modification signal 167 that may modify a gating signal 168 produced by the gate driver 164. That is, the waveform modification signal 167 may adjust the output of the gate driver 164 (e.g., the gating signal 168) and modify the operation of the semiconductor power switch 162 to be temporarily turned on to clamp or attenuate the collector-emitter voltage $V_{CE}$ across the semiconductor power switch 162 to below a maximum $V_{CE}$ allowable for the semiconductor power switch 162 to prevent damage from occurring within the semiconductor power switch 162. The waveform modification signal 167 may be generated only for the short periods of time during the short overvoltage and not by other events that may be encountered.

It should be noted that the components described with respect to FIG. 4 are examples with respect to certain aspects as to the operation of the power switches 151 and 162, and the gate driver 154 and 164 to provide short term overvoltage protection. Certain operational conditions and improvements to the embodiment of FIG. 3 will be discussed in detail below with reference to FIGS. 5-15.

With the preceding in mind, the implementation of the signal conditioning block 154 (or 164) may depend on the semiconductor technology of the protected switch 152 (or 162) and the implementation of the gate driver 154 (or 164). As a result, the present disclosure introduces a conceptual design of the signal conditioning block 154 (or 164) that may be applicable for other gate drivers and other semiconductor switches and then shows a few exemplary implementations.

Figure 5:
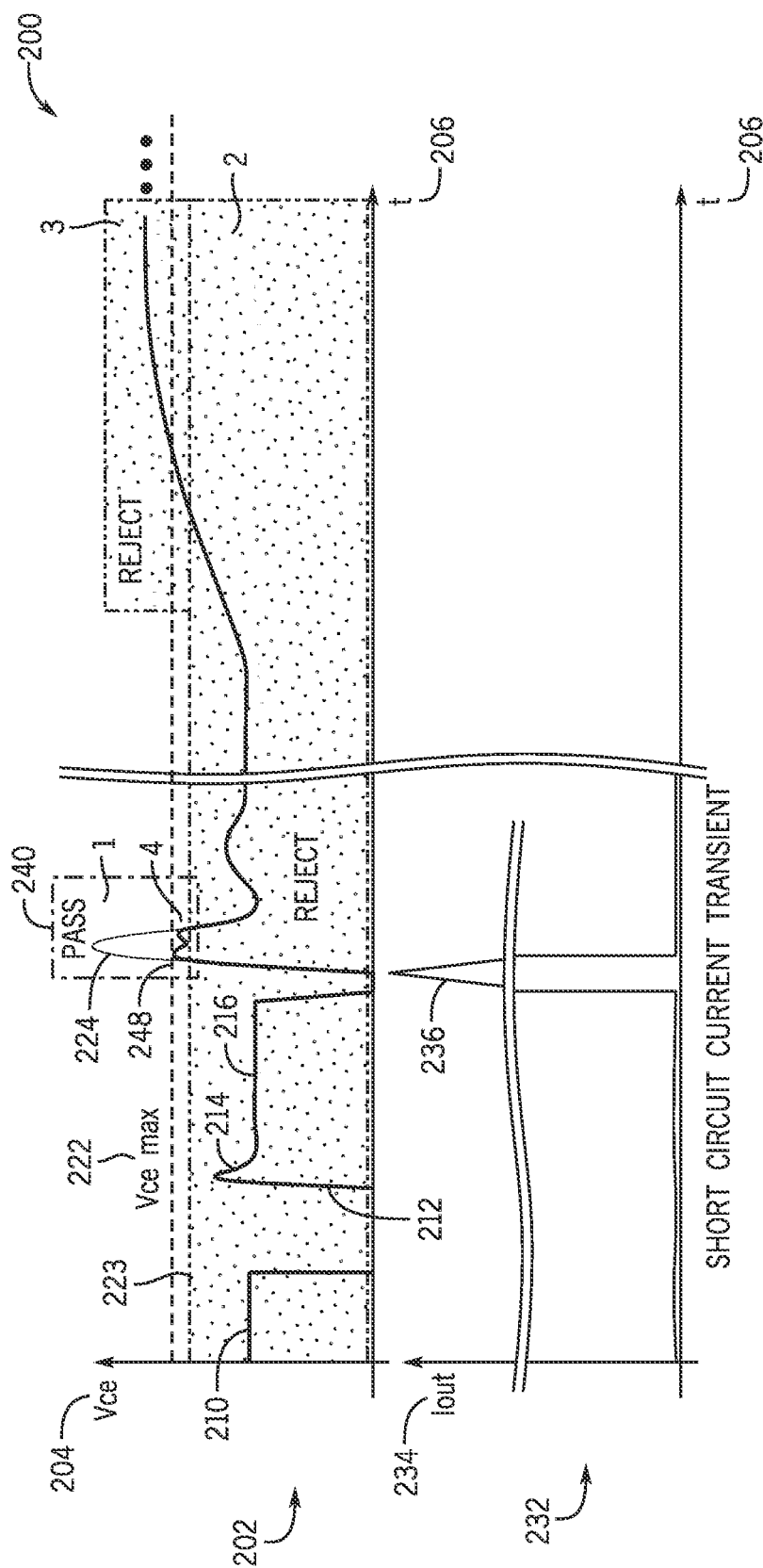
FIG. 5 illustrates an electrical signal diagram to illustrate operations of signal conditioning blocks of FIG. 4 and their relations to other subsystems of a power conversion system, in accordance with an embodiment presented herein.

FIG. 5 is an electrical signal diagram 200 to illustrate operations of the signal conditioning blocks (e.g., 154 and 164) of FIG. 4 and their relations to other subsystems of a power conversion system. An upper portion 202 of the electrical signal diagram 200 illustrates a Collector-Emitter Voltage ($V_{CE}$) 204 versus time 206 of a switch (e.g., switch 152 or 162) affected by a short circuit current transient 236. A lower portion 232 of the electrical signal diagram 200 illustrates a current 234 (IOUT) flowing through an output terminal (e.g., output 176) of a power structure (e.g., motor drive inverter phase leg 150 in FIG. 4) during the same time period. Before the short circuit current transient 236, certain normal operation switching transients 210, 212, 214, and 216 shown in the in the $V_{CE}$ diagram (upper portion 202) may not cause reaction(s) from the overvoltage protection system. In fact the overvoltage protection system may not react on any event below a threshold voltage 223 that may be set by an overvoltage circuit protection design and may depend on the application details. This means that the signal conditioning block may reject all input signals below the threshold voltage 223.

During the short circuit event, marked as the short circuit current transient 236 in FIG. 5, the current 234 may rise until an overcurrent protection circuit of a drive (e.g., motor drive) detects it and issues a command to a gate driver (e.g., gate driver 154) to turn off the switch. At this time, the switch that carries the current 234 (either 152 or 162 depending on the timing of the short circuit event with respect to a pulse width modulation (PWM) switching pattern) may interrupt the short circuit current transient 236. Upon the interruption, a sharp rise and transient overvoltage 240 may be observed in the $V_{CE}$ diagram. If the power structure in FIG. 4 does not include the overvoltage protection system, depending on the stray inductances of the power structure carrying the current 234 and the level of the short circuit current transient 236, the $V_{CE}$ 204 would have behaved as illustrated with a peak 224. The peak 224 may be high enough to damage or even destroy the switch interrupting the short circuit current transient 236. The overvoltage protection system may therefore react to a voltage above the threshold voltage 223 set by the overvoltage circuit protection design and attenuate the peak 224 to the levels below a maximum value 222 ($V_{CE}$ max). This maximum value 222 may be below a datasheet rated maximum voltage of the protected switch to account to the circuit tolerances and increase the reliability of the system. In terms of signal conditioning block, this means that the signals above the threshold voltage 223 may not be rejected.

Assuming that the switch 152 in FIG. 4 was affected by the short circuit event described above and needs to be protected during the turn OFF action described above, the signal conditioning block 156 may detect the rise above the set threshold voltage 223 and output the modification signal 157. As a result of the modification signal 157, the operation of the gate driver 154 may be modified and the turn OFF sequence of the switch 152 may also be modified, causing the switch 152 to partially turn back ON and clamp the overvoltage across its terminals. To summarize, the signal conditioning block 156 may pass signals above the threshold 223 through, adjust and merge the signals with the gating signal 158, such that the above described overvoltage protection on the protected switch 152 is achieved.

After the affected switch (e.g., switch 152) interrupts the short circuit current transient 236, the current 234 flowing through the output 176 in FIG. 4 may continue to flow through antiparallel (or flywheel) diodes of the switch until it decays to zero. It should be noted that flywheel diodes may be intrinsically part of certain power switches (e.g., IGBT, MOSFET) or may be added to other switching technology (e.g., BJT) if not present. A collector emitter voltage 248 of the affected switch may consequently oscillate around the values of the DC bus voltage (159 (DC+) to 169 (DC−) in FIG. 4). If a power converter (e.g. power converter 12) is connected to a load like induction motor, the length of the decay and magnitude of the currents may be enough to pump up the DC bus voltage above the threshold voltage 223 and even $V_{CE}$ max 222 set by the overcurrent protection circuit design, but may not be above the datasheet rated maximum voltage of the switch. Since the power structure in FIG. 4 is in the OFF state at this time, the overcurrent protection circuit may not react to this increase and may not turn ON the protected switch. This increase may take orders of magnitude longer than the short circuit event depicted by the peak 236 in FIG. 5 and is referred to as slow increase or sustained overvoltage in this disclosure. To summarize, the signal conditioning block may reject slow (low frequency) signals above the threshold voltage 223 and pass, process and merge fast (high frequency) signals into the gate drive signal (e.g., gating signal 158). As illustrated above with respect to the electrical signal diagram in FIG. 5, signal conditioning block 156 (or 166) in FIG. 4 is intended to generalize and improve the functions of the diode plus Zener diode structure in FIG. 2. The functionalities for the signal conditioning block 156 (or 166) include: a) To reject all events below a design set voltage level threshold (e.g., threshold voltage 223 in FIG. 5). b) To detect fast transient signals above the design set voltage threshold and produce the modification signal 157 (or 167) that may be injected to the gate driver 154 (or 164) and appropriately modify the gating signal 158 (or 168) of the main switch 152 (or 162) such that the overvoltage caused by the turn OFF and interruption of high current levels may be below some predefined $V_{CE}$ max threshold (e.g., 222 in FIG. 4). c) To reject all slow transient events above the design set voltage level threshold. This is direct improvement over the diode plus Zener diode structure in FIG. 2 which may in case of the slow voltage increase above the Zener breakdown voltage react and turn ON the protected switch. Depending on the length of overvoltage, the Zener diode 52 or the gate driver 60 in FIG. 2 sinking the current from the Zener diode 52 may potentially overheat or even fail due to the excess current flow. The definition of slow transient in this context means that the time constants associated with these signals may be much longer than the time constants associated with the signals described under b). This may also mean that the dominant spectral components of the signals caused by the slow transients may be much lower in frequency spectrum than the signals produced by the fast transients under b). In parallel to the functionalities given above, the signal conditioning block 156 (or 166) in FIG. 4 may fulfil the following electrical functionalities: a) On the input side, signal conditioning block 156 (or 166) in FIG. 4 may have high impedance and may not interfere with the protected switch under any circumstances except when the overvoltage protection operates. In other words, the signal conditioning block 156 (or 166) may interface and withstand sustained high input voltage levels at or above the threshold voltage 223 in FIG. 5. B) On the output side, the signal conditioning block 156 (or 166) in FIG. 4 may interface with low voltage gate driver 154 (or 164) in an appropriate way discussed below. c) Signal conditioning block 156 (or 166) in FIG. 4 may condition the input signal (e.g., switching command 155 or 165) in the form of high voltage transient measured across Collector-Emitter (or Collector-Gate) of the main switch 152 (or 162) in FIG. 4 into a low voltage signal with appropriate current, voltage waveform, and amplitude to modify the gating signal 158 (or 168) and achieve the desired partial turn on of the main switch 152 (or 162) in FIG. 4 and appropriate clamping of the overvoltage and consequently transient overvoltage protection of the protected switch 152 (or 162).

With the above in mind, the following embodiments with respect to FIGS. 6-9 illustrate various active overvoltage protection system concepts. The implementation of various components in the FIGS. 6-9 may vary. Some example implementations of the components in the FIGS. 6-9 are provided in following sections.

Figure 6:
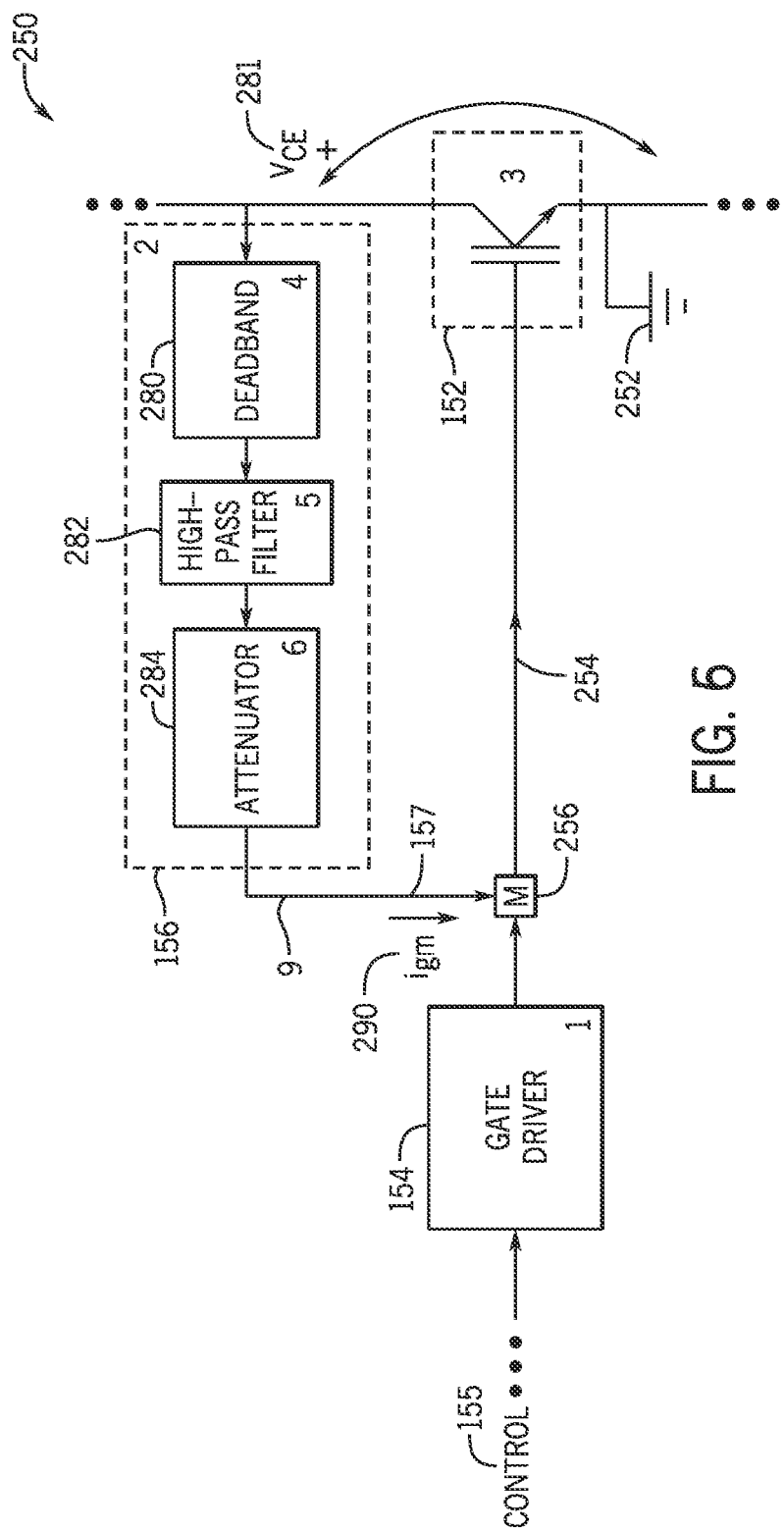
FIG. 6 illustrates a block diagram of a first embodiment of an active overvoltage protection system concept, in accordance with an embodiment presented herein.

FIG. 6 illustrates a first embodiment 250 of an active overvoltage protection system concept for one switch (e.g., switch 152 in FIG. 4) that may fulfil the functionalities described above. For the purpose of explanation, a reference 252 for all voltage signals of interest is placed at an emitter of an emitter terminal of the switch 152 (illustrated as IGBT). A dead band block 280 inputs the $V_{CE}$ voltage 281 and outputs a signal that follows its input (or follows input with an offset) only if the input amplitude is higher than a predefined threshold. In light of the previous discussion, the dead band block 280 rejects all the signals below some threshold (e.g., threshold voltage 223 in FIG. 5). A high pass filter block 282 takes the input from the output of the dead band block 280 and passes only high frequency signals. In light of the previous discussion, the high pass filter block 282 rejects the slow sustained overvoltage. The implementation of the high pass filter block may vary depending on the application. As an example, slow transients may have dominant components at kHz and Hz range while the fast transients associated with short circuit recovery overvoltage transients may have dominant components in MHz range for a standard motor drive. An attenuator block 284 attenuates input voltage signal found across the switch 152 to a low voltage/current signal 290 that is then added to the signal output of the gate driver 154 to form a gate driving signal 254 that may produce the desired clamping effect across the switch 152 in case of the overvoltage conditions across the switch terminals. An addition block 256 in case of a current signal (which is the case herein) may include a circuit node with 3 branches.

In light of electrical functionalities set forth above, if the overvoltage protection circuit is implemented with discrete components, the dead band block 280 may act as high impedance for all signals below the predefined threshold. The high pass filter block 282 may act as a high impedance for the slow sustained signals above the predefined threshold. The dead band block 280 and high pass filter block 282 may still be low impedance for the high frequency components above the predefined threshold for the dead band block 280. If the instantaneous power and current levels used to modify the gating signal 158 of the switch 152 to turn the switch 152 in the desired amount of time are low, the attenuator block 284 may be used to add the impedance to the signal path that is high enough to protect the system form overload and yet achieve the desired partial turn ON of the switch 152 in cases of the fast overvoltage conditions and appropriate clamping effect. As illustrated in FIG. 6 the union of the attenuator block 284, high pass filter block 282, and dead band block 280 in this case forms the signal conditioning block 156.

The first embodiment 250 in FIG. 6 assumes that the power levels for the gate signal modification are low. In cases when this assumption is not valid, an improvement to the first embodiment 250 in FIG. 6 is given in a second embodiment 300 of the active overvoltage protection system concept in FIG. 7. The second embodiment 300 in FIG. 7 adds an amplifier block 336 to the output of the output of the attenuator block 334. The dead band block 330, high pass filter block 332, attenuator block 334 and addition block 320 have the same functionality as the respective blocks 280, 282, 284, and 256 in the first embodiment 250 in FIG. 6. The amplifier block 336 of the second embodiment 300 amplifies the power of a modification signal 316 added to the output signal 312 of the gate driver 304 to the levels used for the desired clamping effect in the overvoltage cases while still allowing the high impedance of the entire signal conditioning block 306 on the input (high voltage) side. It should be noted that, although average power levels for a single turn ON/OFF of a semiconductor power switch are extremely low, the peak power levels rise dramatically with the increase in the turn ON/OFF speed and increase in the power rating of the semiconductor power switch. As the reaction times of the signal conditioning circuit may be below the ON/OFF transient times, in most cases the peak power levels used for the output of the signal conditioning circuit may be high relative to the gate driver peak power. It should be noted that the same power supply used for the gate driver 304 may be used for the amplifier block 336.

Figure 7:
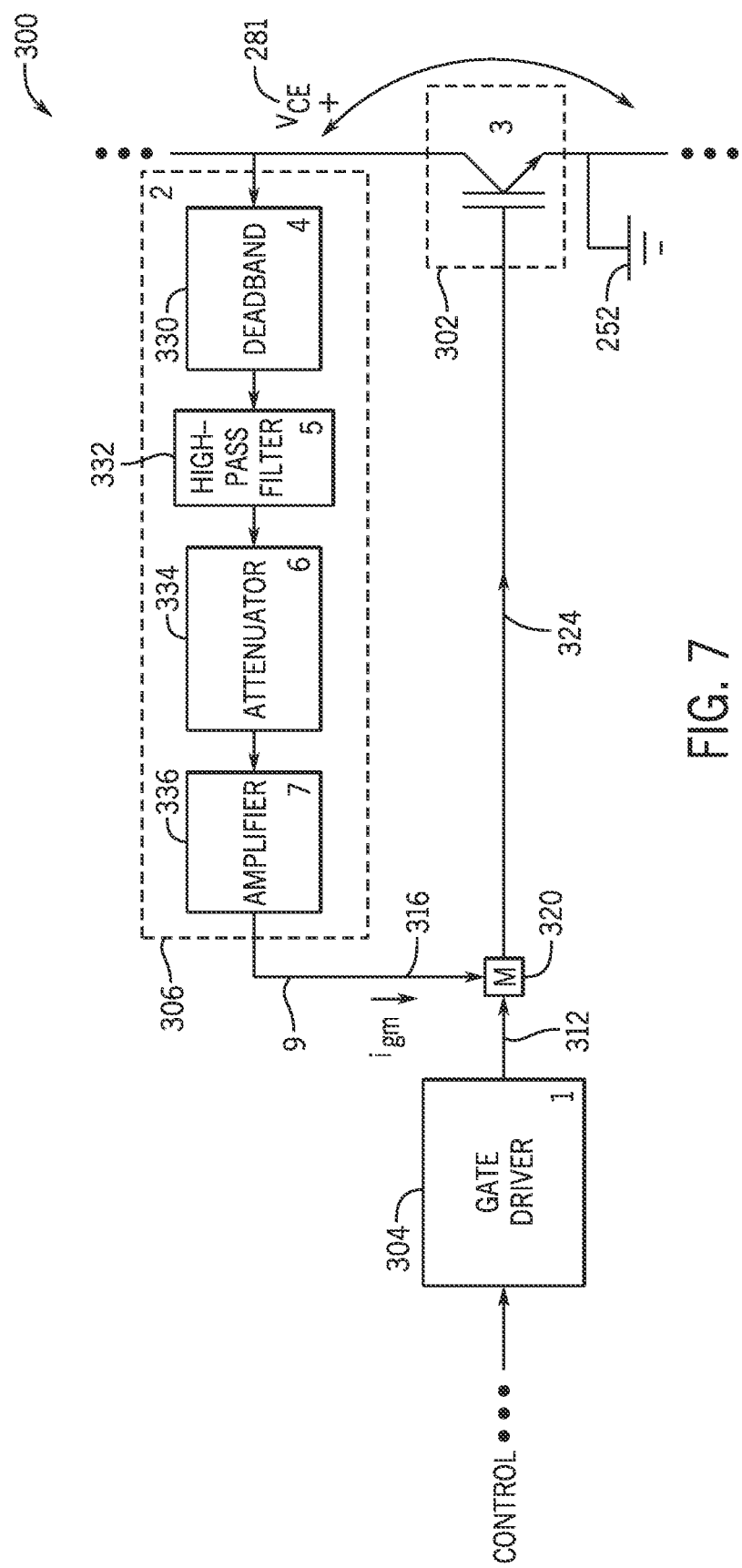
FIG. 7 illustrates a block diagram of a second embodiment of the active overvoltage protection system concept, in accordance with an embodiment presented herein.
Figure 8:
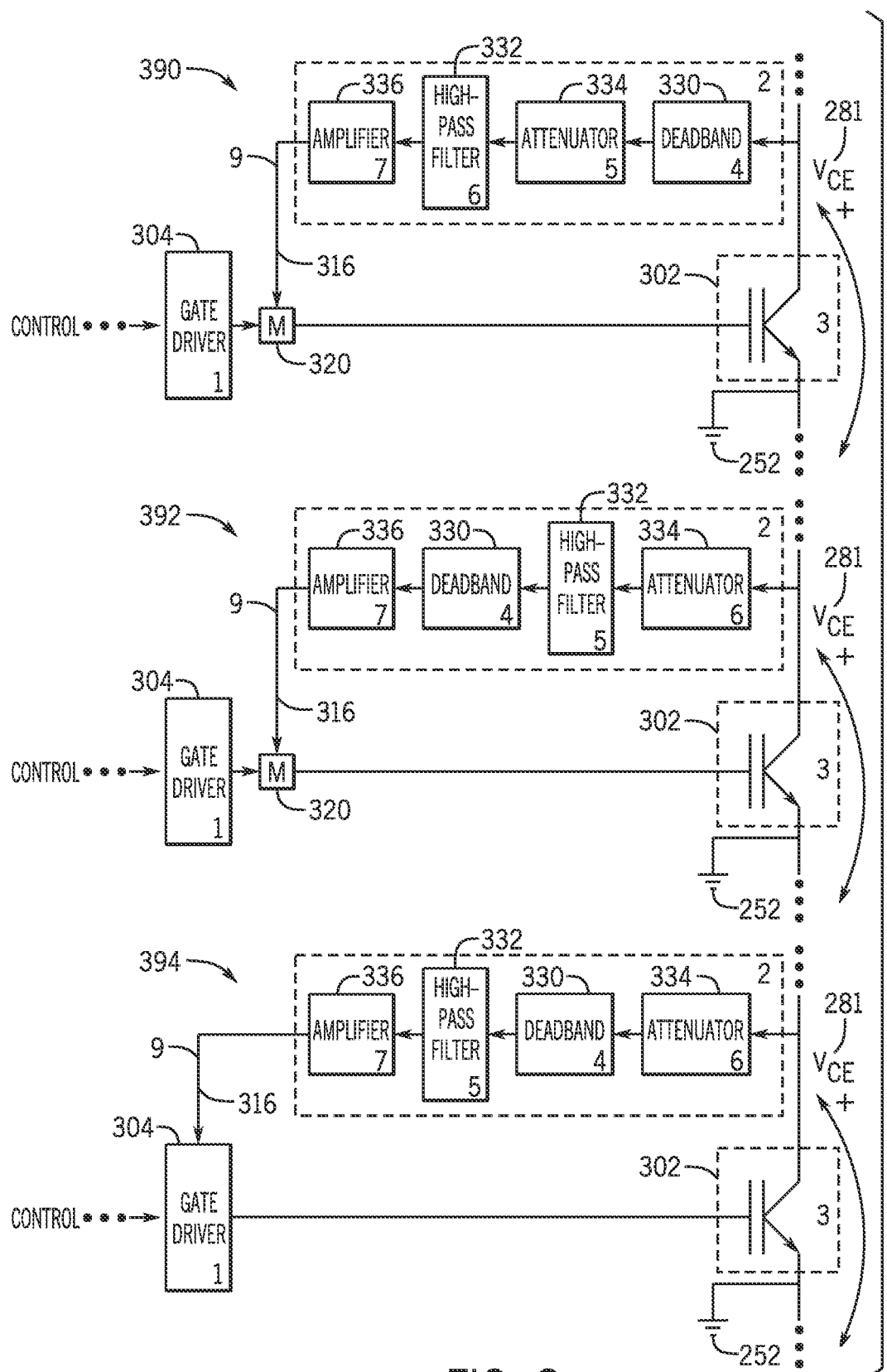
FIG. 8 illustrates variation embodiments of the active overvoltage protection system concept, in accordance with an embodiment presented herein.

To further elaborate the first and second embodiments 250 and 300 shown in FIG. 6 and FIG. 7. FIG. 8 illustrates different variation embodiments of the overvoltage protection system concept that may be varied but may still achieve the same desired functionality. The same reasoning may be applied to other embodiments of the present disclosure. For example, the high pass filter block 332 and attenuator block 334 may exchange places as shown in a variation embodiment 390. In this case the filtering of the signal is done at low voltage. Attenuator block 334 and dead band block 330 may also exchange places in the signal flow path as shown in a variation embodiment 392. In this case the entire signal conditioning after the attenuator block 334 is done at low voltage. It is also possible to achieve the same functionality with the sequence: attenuator block 334, dead band block 330 and high pass filter block 336 as shown in a variation embodiment 394. Furthermore, the injection point of the modification signal 316 may not be at the very output of the gate driver 304. In some cases, the gate driver 304 may have stages and amplifier of its own and the injection point of the modification signal 316 may be at any point inside the gate driver circuit as long as the desired overvoltage clamping functionality is achieved. It should be noted that the amplifier block 336 is the last block outputting the modification signal 316 as the other blocks perform impedance limitation to the input side.

Each of the above-mentioned variation embodiments may have certain tradeoffs. From the circuit speed standpoint, the most beneficial is to inject the modification signal 316 at the output of the gate driver 304 as shown in the embodiments 250, 300, 390 and 392. From the cost perspective, the embodiment 394 may be the most beneficial as the gate driver output stage may be used to amplify the signal and the amplifier block 336 power may be lower or it may be omitted entirely. The embodiments 392 and 394 may also be more cost effective as most of the signal processing may be done at low voltage (after the attenuator block 334). All blocks in FIG. 6, FIG. 7 and FIG. 8 except the amplifier block 336 may be passive and no supply may exist for their implementation. In case of the active circuit implementation the high impedance and high voltage tolerance may be solved with the attenuator block 334 as the first block in signal flow sequence (e.g., in the embodiments 392 and 394) and the rest of the signal conditioning may be done on low voltage with active circuitry. The supply for the active circuits may be taken from the gate driver supply.

Figure 9:
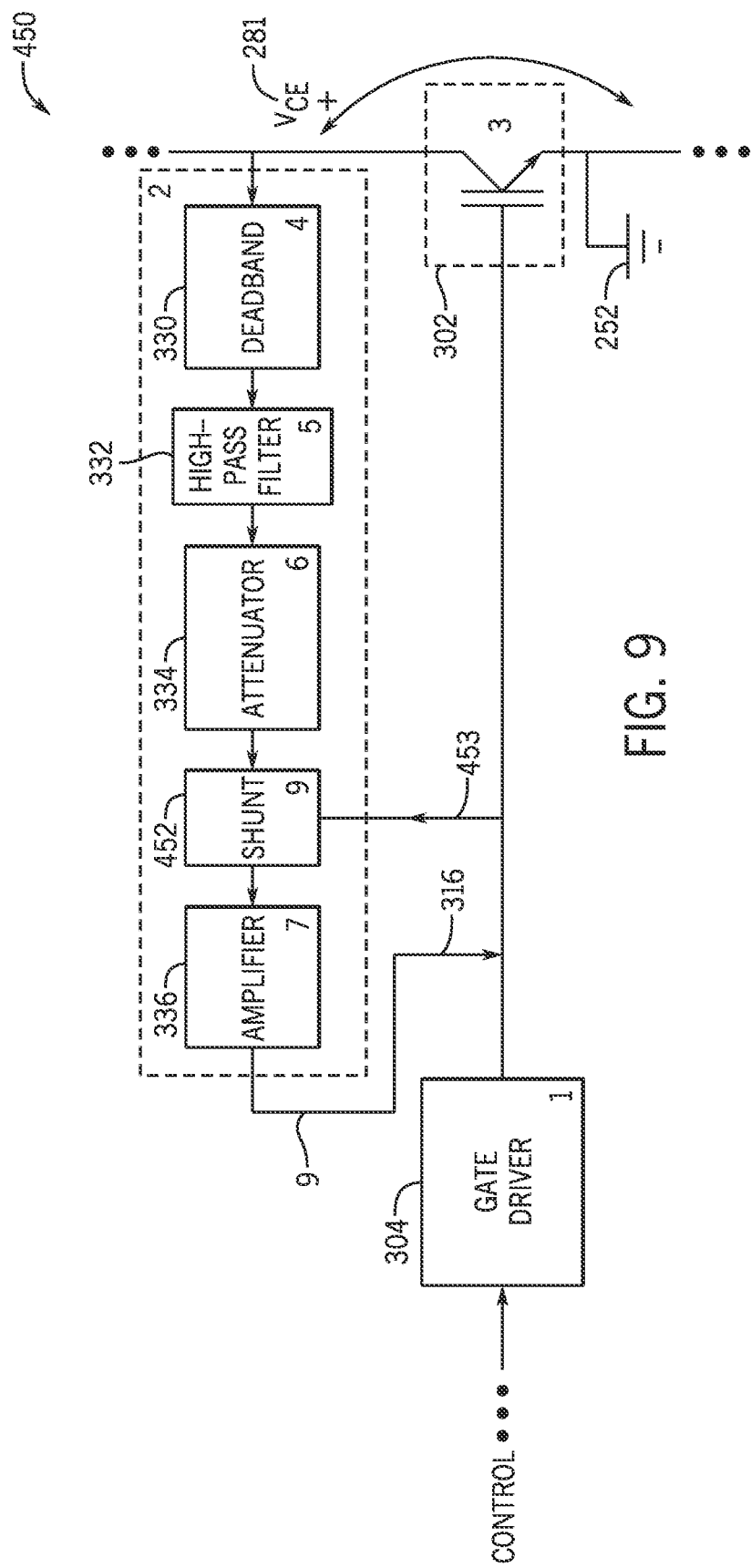
FIG. 9 illustrates a block diagram of a third embodiment of the active overvoltage protection system concept, in accordance with an embodiment presented herein.

The first and second embodiments 250 and 300 and their variations 390, 392, and 394 may rely on the overvoltage protection system of the power conversion system (motor drive, grid tie inverter, DC/DC converter or similar) that may stop the switching as soon as irregular conditions are detected (e.g., short circuit or overvoltage or similar). The first and second embodiments 250 and 300 and their variations 390, 392, and 394 may not tolerate switching transients caused by the adjacent switches in cases when the DC bus voltage is above the threshold voltage (illustrated as 223 in FIG. 5) as this may create high voltage and high speed transients which the first and second embodiments 250 and 300 are designed to react upon. FIG. 9 illustrates a third embodiment 450 of the active overvoltage protection system concept that may solve this problem by adding a shunt block 452 before the amplifier block 336. The shunt block 452 redirects or attenuates the signal at the input of the amplifier block 336 to a negligible levels and disables the functionality of the overvoltage protection system when the switch 302 is in the OFF state while still keeping the overvoltage protection active during the turn OFF transient. The appropriate conditions may be evaluated based on the gate voltage which is taken as an input 453 to the shunt block 452.

Figure 10:
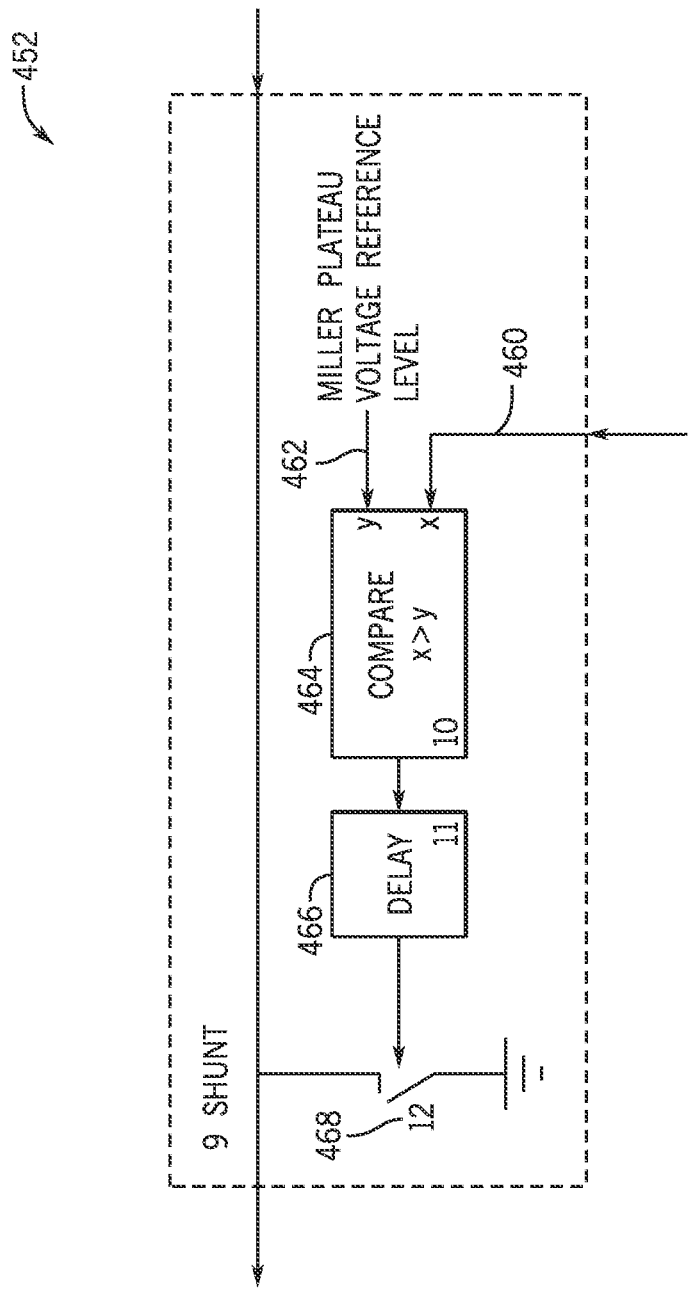
FIG. 10 illustrates a block diagram of a shunt circuit that may be used in the third embodiment of FIG. 9, in accordance with an embodiment presented herein.

To further elaborate the third embodiment 450 and the shunt block 452 in FIG. 9. FIG. 10 shows further details on the shunt block 452. The conditions for the activation of the shunt and the disabling of the overvoltage protection system given in the third embodiment 450, may be obtained from a gate-emitter voltage 460 of the protected switch 302. The gate-emitter voltage 460 may be compared by a comparator 464 to a Miller plateau voltage 462 to evaluate when a switching transient (e.g., caused by a turn OFF operation of the switch) is ended. After the end of the turn OFF switching transient, the overvoltage protection may be disabled. Miller plateau is commonly associated with power semiconductors and the Miller plateau voltage may be observed as long as the Miller capacitance is charging/discharging, which is in this case, as long as the voltage across the switch is increasing. As soon as the voltage increase is over, the maximum voltage is reached, meaning that the protection may be disabled. If needed, a delay circuit 466 may be added to extend the protection activity for the potential oscillations and secondary peaks caused as a result. The shunt effect may be achieved by shorting the input of the amplifier block 336 by, for example, a shunt switch 468 (e.g., MOSFET, BJT or a similar switch device) and in effect making its input effectively zero and disabling the overvoltage protection operation.

Now that the concepts of the overvoltage protection circuit have been explained, a possible implementation of each circuit block may be shown as an example in the following sections. The first, second and third embodiments 250, 300, and 450 may be implemented by using block implementations but are not limited by them. Depending on the design limitations and functionalities, the implementation of each circuit block may vary as long as the functionality of each block described in the previous sections is kept.

Figure 11:
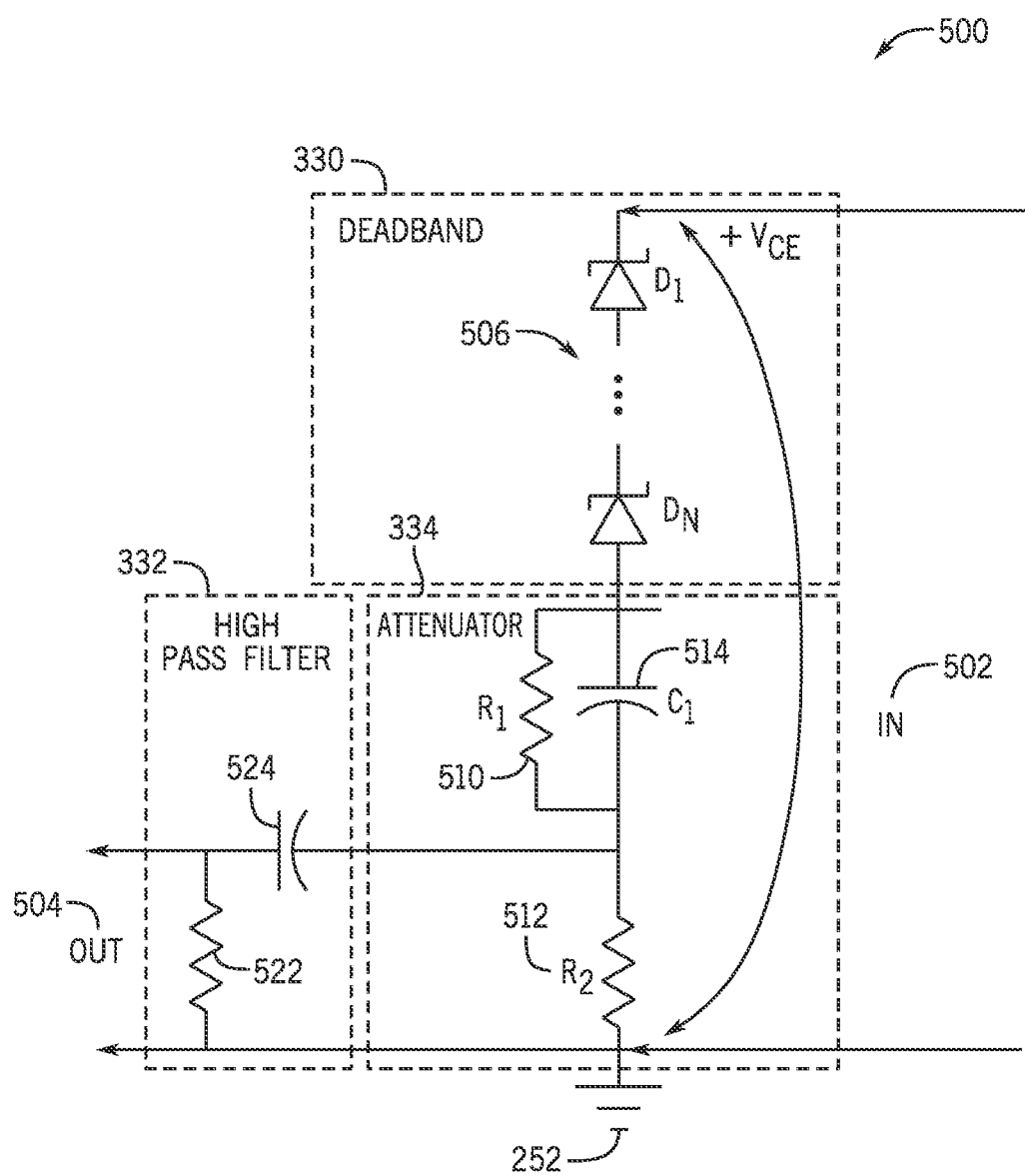
FIG. 11 illustrates a first example implementation structure that may be used in the variation embodiments of the active overvoltage protection system concept of FIG. 8, in accordance with an embodiment presented herein.

FIG. 11 illustrates a first example implementation structure 500 of the dead band block 330, attenuator block 334, and high pass filter block 332 that may be used in the concept variation embodiment 390 of the first, second and third embodiments 250, 300, and 450. The input 502 of the implementation structure 500 may be a voltage across the protected switch (e.g., the collector-emitter voltage 281 as illustrated in FIG. 8 or a collector-gate voltage) and an output 504 may be a signal injected at the gate-emitter terminals of the gate driver or a signal going to the input of the amplifier. Dead band block 330 may be implemented as a string of Zener diodes or TVS diodes 506. Zener diodes may not conduct below a breakdown voltage of the string and may, in turn, reject all signals below the breakdown voltage of the string (e.g., the predefined threshold voltage 223 in FIG. 5). The output of the dead band block 330 may follow the input 502 with an offset equal to the breakdown voltage of the string, if the input 502 is above the breakdown voltage. Attenuator block 334 may be implemented as a resistor divider comprised of resistors 510 and 512. The attenuator block 334 may have lower attenuation for the high frequency signals (e.g., implemented using a capacitor 514) to achieve higher signal power at high frequencies at the output. High pass filter block 332 may be implemented as a simple RC differentiator (high pass filter) including a resistor 522 and a capacitor 524 that may filter out all low frequency components passed through the attenuator block 334.

Figure 12:
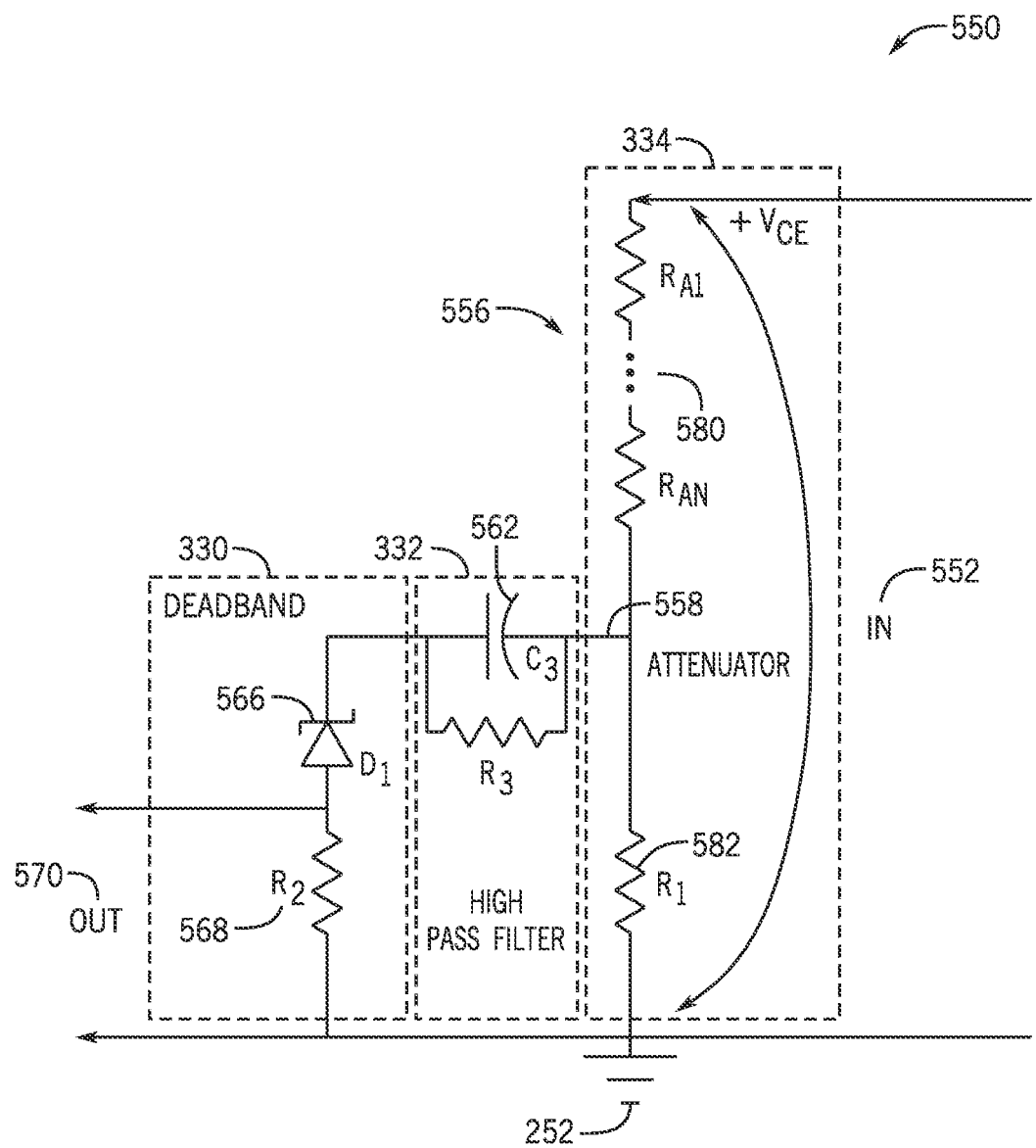
FIG. 12 illustrates a second example implementation structure that may be used in the variation embodiments of the active overvoltage protection system concept of FIG. 8, in accordance with an embodiment presented herein.

To illustrate how the above mentioned blocks may exchange places and achieve concept variations described FIG. 8, FIG. 12 shows a second example implementation structure 550 of the attenuator block 334, high pass filter block 332, and dead band block 330 that may be used in the concept variation embodiment 392. Attenuator block 334 may be implemented as a resistive divider circuit 556 including a set of resistors 580 coupled in series with a resistor 582 that may scale a high voltage input signal 552 (e.g., a collector-emitter voltage or collector-gate voltage) to a low voltage signal 558 at the levels usually found at the gate driver circuit. The low voltage signal 558 is then filtered using a R-C high pass filter 562 in the high pass filter 332. From the high pass filter block 332, the signal goes to the dead band block 330 that may be implemented as a single, low voltage, Zener diode 566 and a resistor 568. As in the previous case (implementation structure 500) the Zener diode may not conduct below the breakdown voltage that may be used to tune the consequent voltage threshold (e.g., 223 in FIG. 5). In turn the signals below the voltage threshold may be rejected and the signals above may pass with the Zener voltage offset. Form the dead band block 330 an output signal 570 may go to the input of the amplifier block 336 not shown in FIG. 12. An implementation example of the amplifier block 336 will be given in the following sections with respect to FIG. 14.

Figure 13:
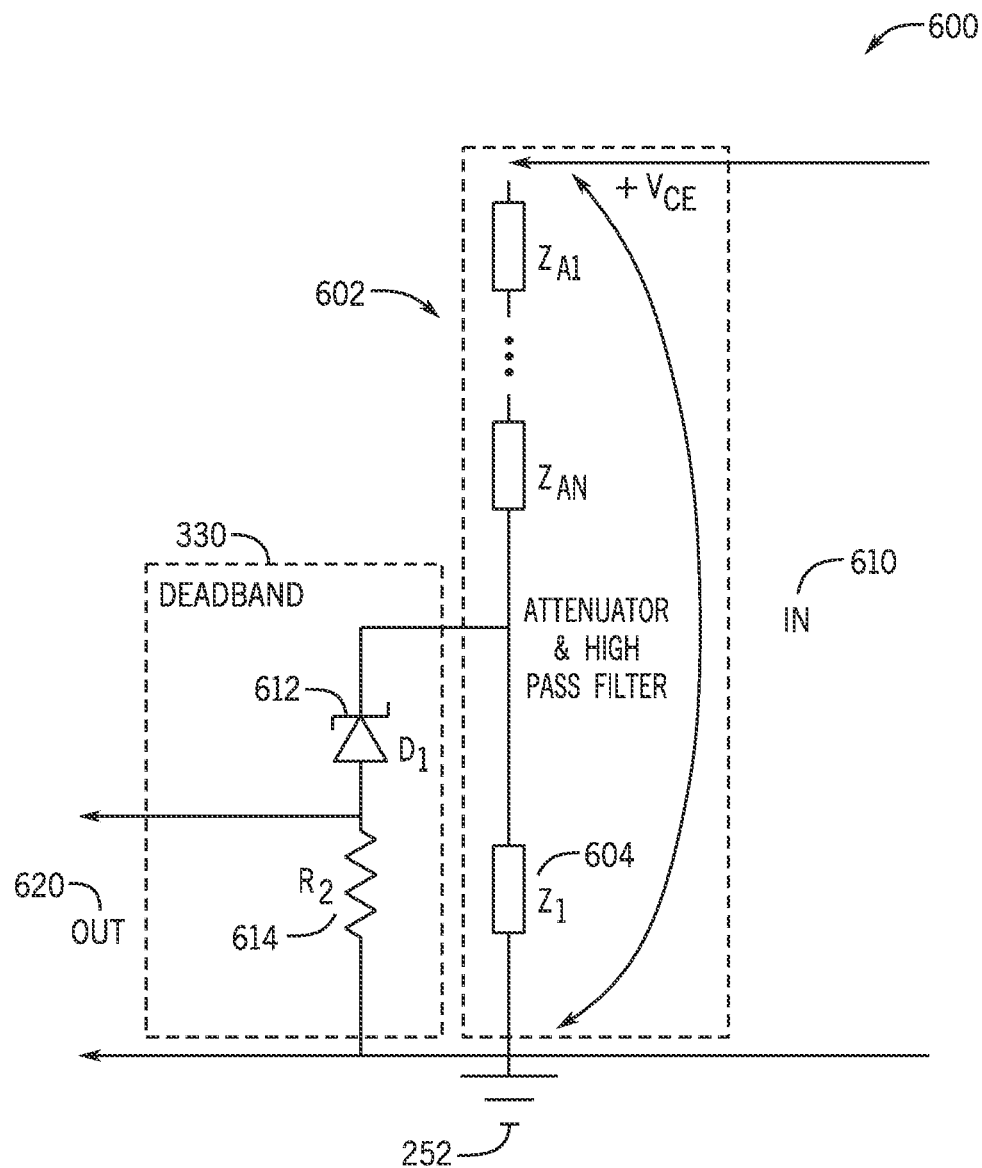
FIG. 13 illustrates a third example implementation structure that may be used in the variation embodiments of the active overvoltage protection system concept of FIG. 8, in accordance with an embodiment presented herein.

FIG. 13 illustrates a third example implementation structure 600 of the attenuator block 334, dead band block 330, and high pass filter block 332 that may exchange places and even be implemented in the same circuit. A combined attenuator and high pass filter 602 may be achieved using a series connection of impedances 604 implemented suitable connection of resistors, capacitors and inductors. Per circuit theory, these impedances 604 may be adjusted to achieve the desired attenuation and high pass filtering of an input signal 610. The output of the combined attenuator and high pass filter may be fed into the dead band block 330 implemented with a Zener diode 612 and a resistor 614 functioning in the same was as explained in relation to FIG. 13. An output 620 from the dead band block 330 goes to the amplifier block 336 not shown in FIG. 12. An implementation example of the amplifier block 336 will be given in the following sections with respect to FIG. 14.

Figure 14:
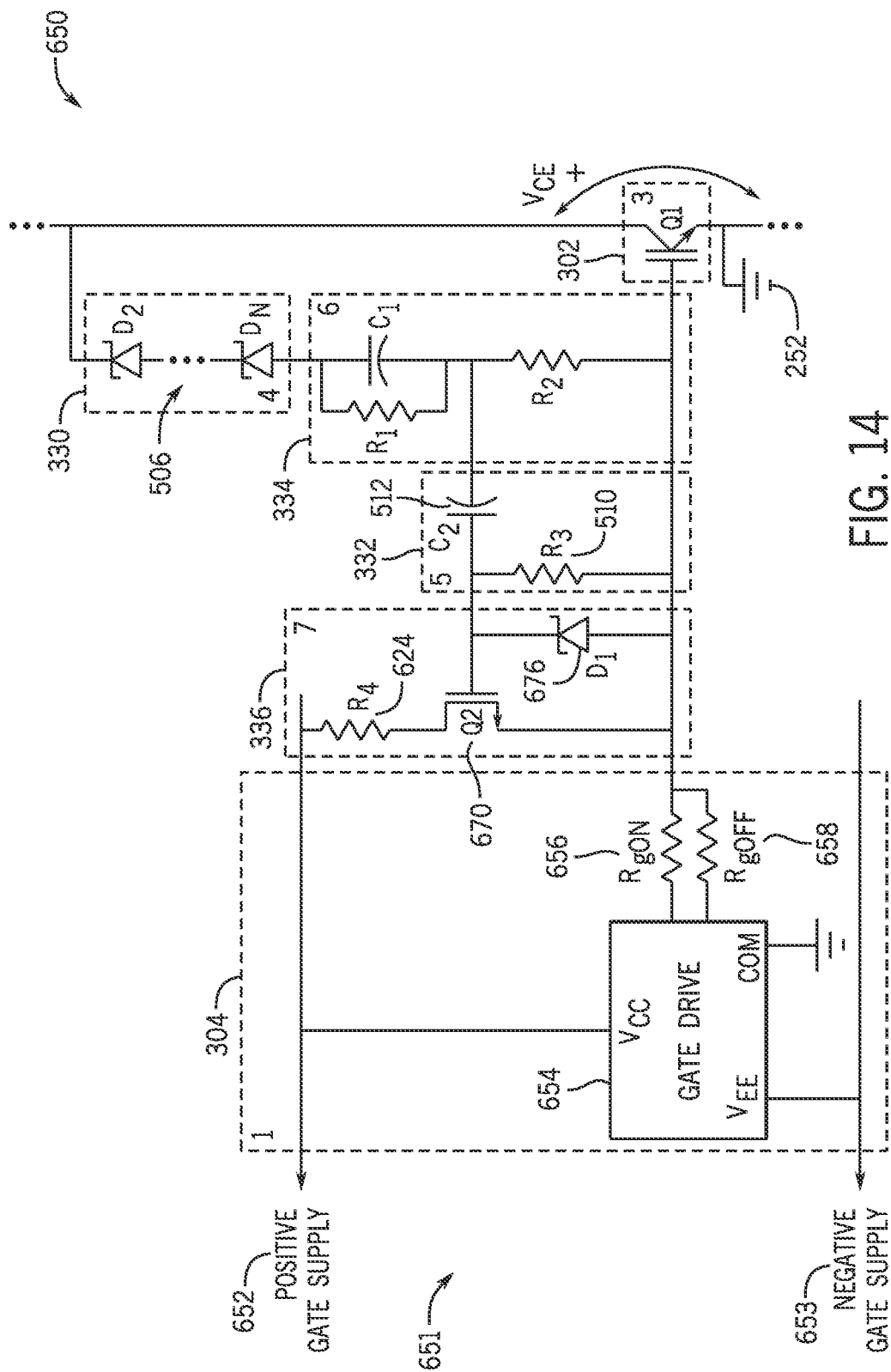
FIG. 14 illustrates an example discrete-component implementation of a variation embodiment of the second embodiment of the active overvoltage protection system concept, in accordance with an embodiment presented herein.

To further illustrate, explain and exemplify the practical implementation of the concepts covered in present disclosure, and the relation of the concepts covered above with a semiconductor switch and its gate driver, FIG. 14 illustrates an example discrete-component implementation 650 of the variation embodiment 390 of the second embodiment 300. The circuit in FIG. 14 shows the semiconductor switch 302 to be protected and the gate driver 304 gating the protected switch 302. The gate driver 304 may include a gate driver power supply 651 that includes a positive gate supply voltage (or rail) 652 and a negative gate supply voltage (or rail) 653 (e.g., a common collector voltage and a common emitter voltage, gate driver integrated circuit 654, and gate resistors 656 and 658. The signal conditioning block 306 is implemented according to the variation embodiment 390 in FIG. 8. The dead band block 330, attenuator bock 334, and high pass filter block 332 are implemented as illustrated and explained in relation to FIG. 8. The amplifier block 336, which is here as one possible example, implemented as a MOSFET based current amplifier 670 supplied from the gate driver power supply 651. The signals from the high pass filter block 332, fed into the MOSFET based current amplifier 670, may bias it into a conducting state and the MOSFET based current amplifier 670 may source the current from the gate driver power supply 651 into the gate of the protected switch 302. The current (and in the effect power) of the low power signal from the high pass filter block 332 may be amplified. A resistor 624 may limit the maximum current supplied by the MOSFET based current amplifier 670. A Zener diode 676 may be used to ensure that the gate voltage of the MOSFET based current amplifier 670 does not exceed the rated maximum under any circumstance. The selection of the component values for the attenuator block 334, high pass filter block 332, and the resistor 624 may be used to adjust the shape of the signal driving the MOSFET based current amplifier 670 and in turn, adjust the signal of current waveform fed into the gate of the protected switch 302 in case of the transient overvoltage. This current from the amplifier block 336 may temporary overpower the turn OFF current flowing into the gate driver 304 and partially turn ON the switch 302, which will in turn clamp the voltage rise across the switch 302 to the tolerated levels. It should be noted that the tuning (and the selection of the components) of the circuit implemented in this way may be conducted experimentally. The breakdown voltage of a string of Zener diodes 680 of the dead band block 330 may determine the threshold voltage (e.g., 223 in FIG. 5) but the shape of the peak of the voltage (e.g. the collector emitter voltage 248 in FIG. 5) across the switch302 may be defined by the attenuator block 334, high pass filter block 332, and MOSFET based current amplifier 670 characteristics. For example, lower attenuation and faster MOSFET may increase the speed of the reaction and decrease the maximum voltage. Bandwidth of the high pass filter block 332 (and resistor 510) may be used to tune the shape of the peak to some extent.

Figure 15:
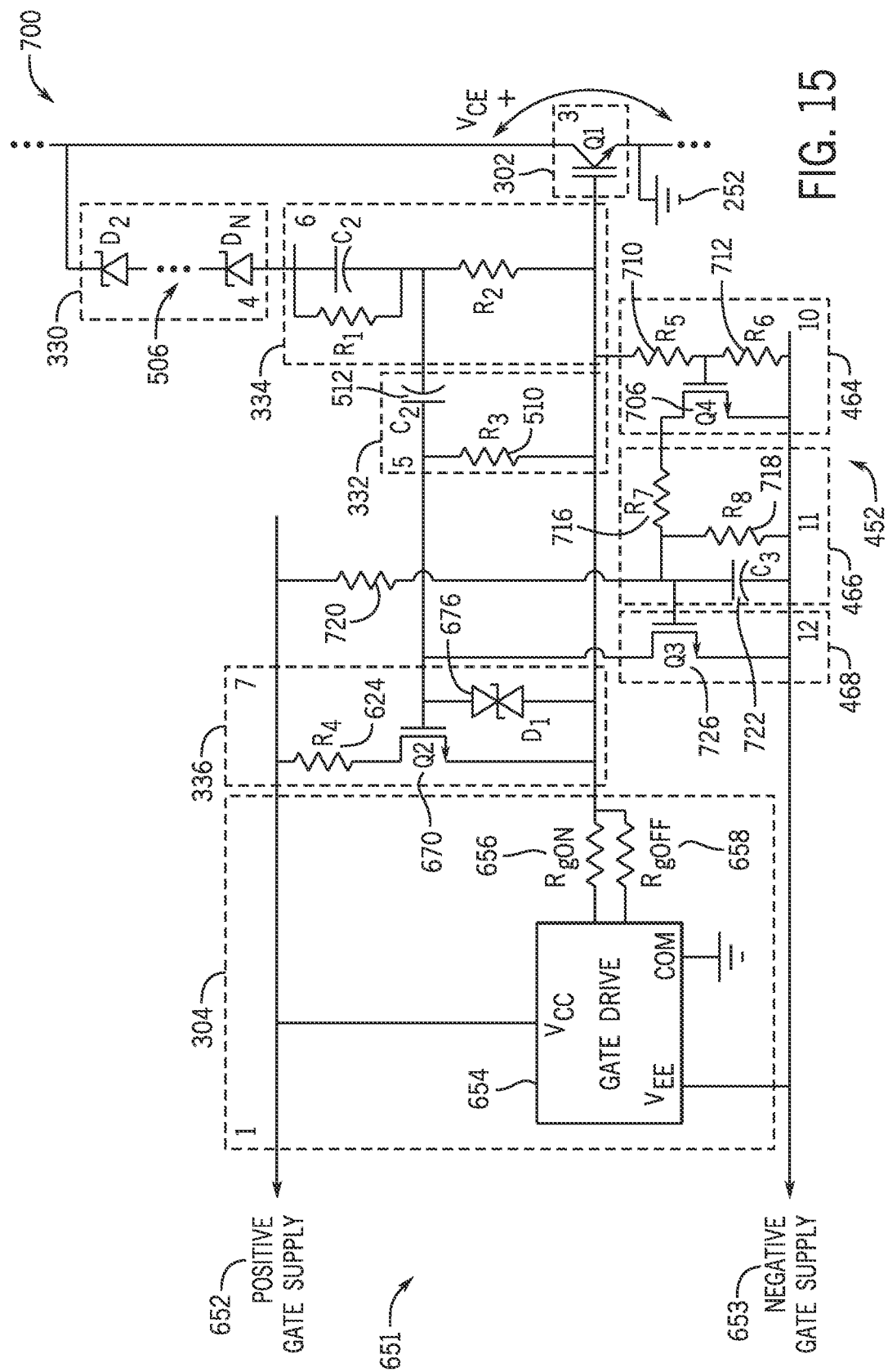
FIG. 15 illustrates an example discrete-component implementation of the third embodiment of the active overvoltage protection system concept, in accordance with an embodiment presented herein.

To illustrate and further explain the third embodiment, another implementation example is given in FIG. 15. This implementation example includes the same circuitry in FIG. 14 with the addition of the shunt block 452. The shunt block 452 is implemented following the concept in FIG. 10. The entire shunt block 452 is referenced to negative rail of the gate power supply 651 instead of the emitter to make the circuit implementation simpler. The compare block 464 is implemented using a MOSFET 706 and a resistor divider circuit consisting of resistors 710 and 712. The resistor divider circuit may scale the voltage measured from the gate of the switch 302 to the negative rail 653 of the gate driver power supply 651. The scaling may be adjusted such that the MOSFET 706 threshold voltage is reached just before the voltage of the switch 302 gate to negative rail 653 of the gate driver power supply 651 reaches the Miller plateau voltage minus negative gate supply rail voltage. This in effect achieves comparison of the gate-emitter voltage (e.g., 460 in FIG. 10) to the Miller plateau voltage (e.g., 462 in FIG. 10). The delay circuit 466 is implemented as a simple RC network consisting of resistors 716, 718, and 720 and a capacitor 722. If the gate-emitter voltage is below the Miller plateau voltage (e.g., the switch 302 is OFF and transients should be over), the MOSFET 706 may turn OFF and the capacitor 722 may charge through 720, until it reaches a voltage defined by resistors 720 and 718. This voltage may be adjusted to properly turn ON a MOSFET 726, which acts as the shunt switch 468, and shunt all signals from the high pass filter block 332 to the negative rail 653 of the gate driver power supply 651. This may in turn disable the amplifier block 336 and the overvoltage protection by negatively biasing the amplifier MOSFET 670. The RC time constant of the resistor 720 and capacitor 722 may be used to tune the delay function of the shunt block 452. Since MOSFET 670 may be negatively biased in this implementation by the shunt block 452, bi-directional blocking TVS may be used instead of Zener diode 612 (in FIG. 13) for the MOSFET 670 gate protection. If the gate-emitter voltage is above the Miller plateau voltage (e.g., the switch 302 is ON), the MOSFET 706 may conduct and discharge capacitor 722 through the resistor 716, as a result the MOSFET 726 may turn OFF and enable the protection for the next turn OFF event.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

The invention claimed is:

1. A system, comprising:
a switch configured to couple to a load;
a gate driver configured to generate one or more gating signals to control one or more operations of the switch;
a signal conditioner configured to:
receive an input signal associated with the switch; and
generate a modification signal configured to modify the one or more gating signals based on the input signal, wherein the modified gating signal is configured to reduce an amplitude of a voltage transient received by the switch to below a voltage threshold.

2. The system of claim 1, wherein the signal conditioner comprises a dead band circuit, a high-pass filter circuit, and an attenuator circuit.

3. The system of claim 2, wherein the signal conditioner comprises an amplifier circuit.

4. The system of claim 3, wherein the dead band circuit comprises a plurality of Zener diodes or transient voltage suppressor (TVS) diodes.

5. The system of claim 3, wherein the high-pass filter circuit comprises a resistor-capacitor circuit.

6. The system of claim 5, wherein the attenuator circuit comprises an additional resistor-capacitor circuit coupled in series with a resistor.

7. The system of claim 3, wherein the attenuator circuit comprises a plurality of resistors coupled in series with a resistor.

8. The system of claim 3, wherein the high-pass filter circuit is configured to couple to the attenuator circuit to form a circuit, and wherein the circuit comprises a plurality of impedance blocks coupled in series with an impedance block.

9. The system of claim 3, wherein the amplifier circuit comprises a resistor, a metal-oxide semiconductor field effect transistor (MOSFET) transistor, and a Zener diode.

10. The system of claim 3, wherein the gate driver comprises:
a gate drive powered by a common collector voltage and a common emitter voltage;
a first resistor associated with a gate ON state of the gate driver; and
a second resistor associated with a gate OFF state of the gate driver.

11. The system of claim 3, wherein the dead band circuit is configured to couple to a collector side of the switch and the attenuator circuit.

12. The system of claim 3, wherein the attenuator circuit is configured to couple to a collector side of the switch and the high-pass filter circuit.

13. The system of claim 3, wherein the attenuator circuit is configured to couple to a collector side of the switch and the dead band circuit.

14. The system of claim 3, wherein the dead band circuit, the high-pass filter circuit, and the attenuator circuit are positioned between the amplifier circuit and a collector side of the switch, and the amplifier circuit is configured to couple to the gate driver.

15. A circuit, comprising:
 a dead band circuit comprising one or more Zener diodes or one or more transient voltage suppressor (TVS) diodes;
 a high-pass filter circuit comprising a resistor-capacitor circuit; and
 an attenuator circuit comprising a plurality of resistors coupled in series with a resistor;
 wherein the circuit is configured to couple across a semiconductor switch configured to provide power to a load component.

16. The circuit of claim 15, comprising a shunt circuit, wherein the shunt circuit comprises a comparison circuit, a delay circuit, and a switch circuit.

17. The circuit of claim 16, wherein the comparison circuit is configured to:
 compare a gating signal with a Miller plateau voltage;
 determine whether the gating signal exceeds the Miller plateau voltage;
 disable the shunt circuit in response to determining that the gating signal exceeds the Miller plateau voltage; and
 enable the shunt circuit in response to determining that the gating signal falls below the Miller plateau voltage.

18. The circuit of claim 16, comprising an amplifier circuit comprising a resistor, a metal-oxide semiconductor field effect transistor (MOSFET) transistor, and a Zener diode.

19. A method, comprising:
 attenuating, via an attenuator circuit of a signal conditioning circuitry, one or more voltage transients associated one or more signals received by a semiconductor switch and below a first voltage threshold;
 converting, via the attenuator circuit, a voltage signal below the first voltage threshold and associated with the one or more signals into a modification signal configured to modify a gating signal generated from a gate driver circuitry;
 attenuating, via a dead band circuit of the signal conditioning circuitry, a first voltage transient associated the one or more signals and above the first voltage threshold, wherein the first voltage transient is associated with a first duration greater than a threshold amount of time;
 passing, via the dead band circuit, within the threshold amount of time, a second voltage transient received by the semiconductor switch and above the first voltage threshold, wherein the second voltage transient is associated with a second duration less than the threshold amount of time;
 attenuating, via the dead band circuit, the second voltage transient to below a second voltage threshold, wherein the second voltage threshold corresponds to a maximum voltage allowable for the semiconductor switch and greater than the first voltage threshold;
 passing, via a high-pass filter circuit, a portion of the modification signal having frequency contents higher than a frequency threshold;
 determining, via a comparison circuit of a shunt circuitry of the signal conditioning circuitry, whether the gating signal exceeds a Miller plateau voltage threshold;
 in response to determining that the gating signal is below the Miller plateau voltage threshold, amplifying, via an amplifier circuit, the portion of the modification signal; and
 injecting, via a modulator circuit, the amplified portion of the modification signal to the gate driver circuitry to modify the gating signal into a modified gating signal, wherein the modified gating signal is configured to enable the shunt circuitry, wherein enabling the shunt circuit disables the semiconductor switch to reduce an amplitude of second voltage transient within the threshold amount of time.

20. The method of claim 19, wherein the semiconductor switch comprises a PNP type bipolar junction transistor (BJT), or a metal-oxide semiconductor field effect transistor (MOSFET), or an insulated gate bipolar transistor (IGBT).

* * * * *